United States Patent
Ando et al.

(10) Patent No.: US 9,048,207 B2
(45) Date of Patent: Jun. 2, 2015

(54) BUBBLE DISCHARGING STRUCTURE, REVERSE PRINTING BLOCK, DISPLAY DEVICE, PRINTING METHOD, AND METHOD OF MANUFACTURING DISPLAY DEVICE

(75) Inventors: Makoto Ando, Tokyo (JP); Tsutomu Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 71 days.

(21) Appl. No.: 13/417,589

(22) Filed: Mar. 12, 2012

(65) Prior Publication Data

US 2012/0244285 A1  Sep. 27, 2012

(30) Foreign Application Priority Data

Mar. 25, 2011 (JP) ................................. 2011-068152

(51) Int. Cl.
| | |
|---|---|
| H01L 27/32 | (2006.01) |
| B05D 1/28 | (2006.01) |
| B41M 1/00 | (2006.01) |
| H01L 51/56 | (2006.01) |

(52) U.S. Cl.
CPC ..... *H01L 27/3246* (2013.01); *Y10T 428/24802* (2015.01); *B05D 1/28* (2013.01); *B41M 1/00* (2013.01); *H01L 27/3211* (2013.01); *H01L 51/56* (2013.01); *H01L 2227/323* (2013.01)

(58) Field of Classification Search
None
See application file for complete search history.

(56) References Cited

U.S. PATENT DOCUMENTS

| | | | | |
|---|---|---|---|---|
| 1,849,598 | A * | 3/1932 | Simms et al. | 101/401.1 |
| 2,905,082 | A * | 9/1959 | Stearns, Jr. et al. | 101/41 |
| 4,489,119 | A * | 12/1984 | Ishige et al. | 428/167 |
| 5,141,461 | A * | 8/1992 | Nishimura et al. | 445/52 |
| 2001/0053648 | A1 * | 12/2001 | Furukawa et al. | 445/24 |
| 2003/0084796 | A1 * | 5/2003 | Kwon et al. | 101/41 |
| 2008/0090049 | A1 * | 4/2008 | Kato et al. | 428/131 |
| 2010/0173553 | A1 * | 7/2010 | Tanaka et al. | 445/24 |
| 2010/0279052 | A1 * | 11/2010 | Chen | 428/57 |
| 2012/0248337 | A1 * | 10/2012 | Kim et al. | 250/459.1 |

FOREIGN PATENT DOCUMENTS

| | | |
|---|---|---|
| JP | 2004-327067 A | 11/2004 |
| JP | 2010-158799 A | 7/2010 |

OTHER PUBLICATIONS

Fujikura News; Development of Membrane Printed Circuit Board with Super Fine; Jun. 2009; accessed at http://www.fujikura.co.jp/eng/f-news/1198236_4207.html on Apr. 17, 2013.*
Fujikura News No. 335; p. 3; Development of Membrane Printed Circuit Board with Super Fine; Jun. 6, 2009.*

* cited by examiner

*Primary Examiner* — Timothy Meeks
*Assistant Examiner* — Michael P Rodriguez
(74) *Attorney, Agent, or Firm* — Wolf, Greenfield & Sacks, P.C.

(57) ABSTRACT

Disclosed herein is a bubble discharging structure, including a substrate which has a first area and a second area adjacent to the first area, and on which a counter substrate is caused to come in contact with the first area to provide a film having a first pattern, and a bubble discharging path through which the first area and the second area communicate with each other, and through which a bubble confined between the substrate and the counter substrate when the counter substrate is caused to come in contact with the first area is discharged from the first area to the second area.

6 Claims, 20 Drawing Sheets

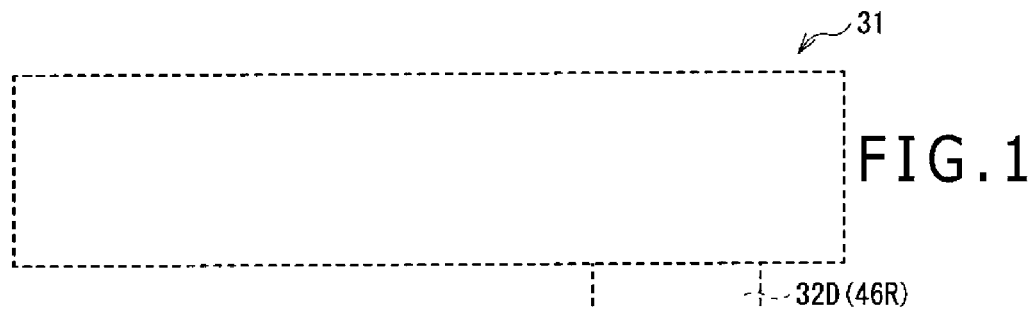
FIG.18A
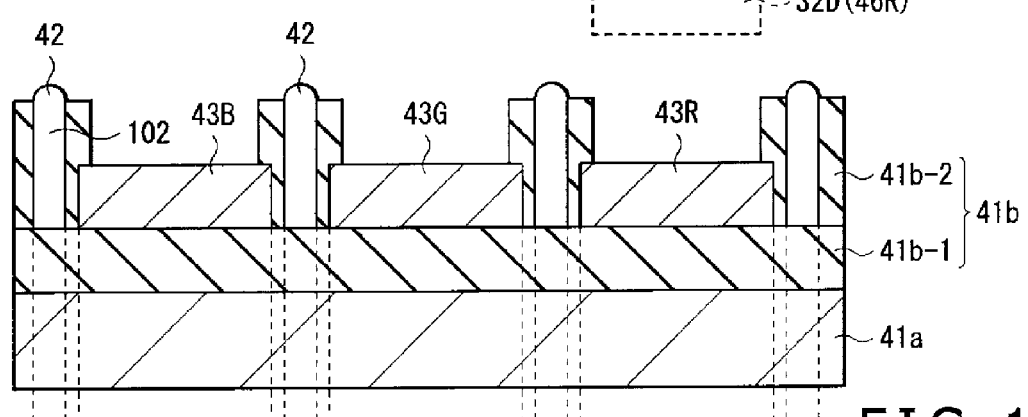
FIG.18B
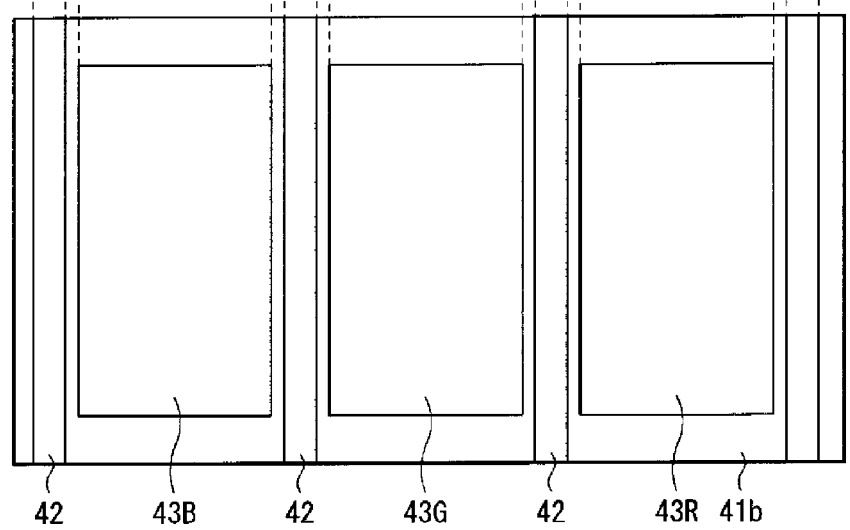

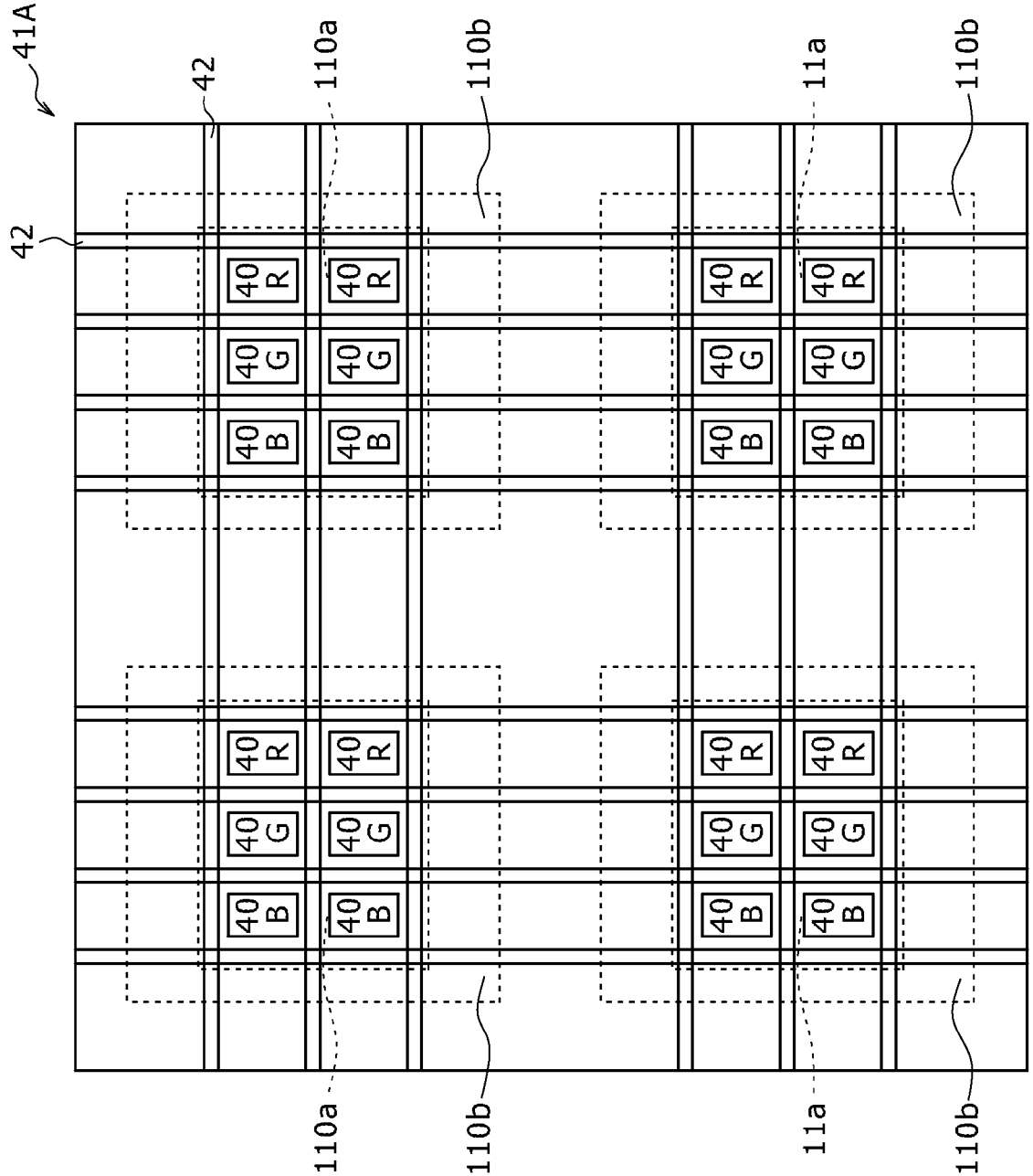

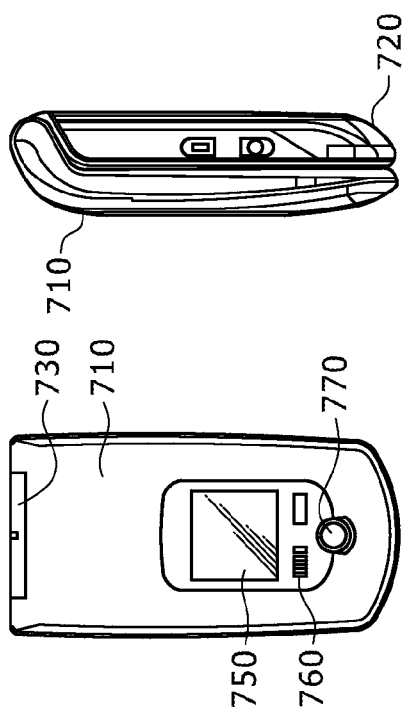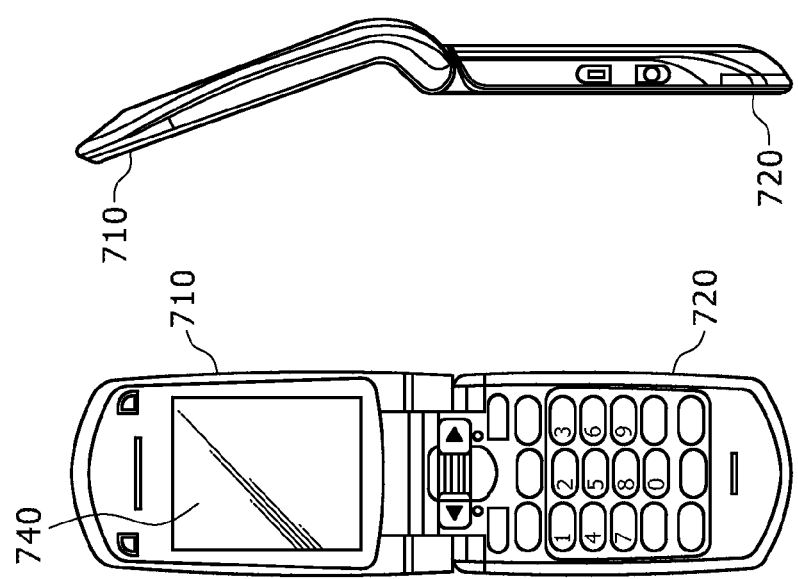

BUBBLE DISCHARGING STRUCTURE, REVERSE PRINTING BLOCK, DISPLAY DEVICE, PRINTING METHOD, AND METHOD OF MANUFACTURING DISPLAY DEVICE

BACKGROUND

The present disclosure relates to a bubble discharging structure for discharging a bubble confined in a space defined between two sheets of substrates in a phase of contact between the two sheets of substrates from a specific area, a reverse printing block for offset printing including the same, a display device including the same, a printing method using the same, and a method of manufacturing the display device.

In recent years, a film deposition technique utilizing a reverse offset printing method has attracted attention because high-definition printing can be carried out at an excellent film thickness precision. The reverse offset printing, for example, is utilized in film deposition for an organic Electro Luminescence (EL) element, a color filter, a circuit wiring, a thin film transistor, and the like.

Until now, with regard to the reverse offset printing method, a method using a roll-like blanket (first method), and a method using a flat plate-like blanket (second method) have been mainly proposed. The first method, for example, is disclosed in Japanese Patent Laid-Open No. 2004-327067. Also, the second method, for example, is disclosed in Japanese Patent Laid-Open No. 2010-158799. In the first and second methods, firstly, a film for transfer is provided on the roll-like or flat plate-like blanket, and is then depressed against a flat plate-like block (reverse printing block), thereby forming a printing pattern on the blanket. The printing pattern on the blanket is transferred onto a substrate receiving the printing.

SUMMARY

However, the first method described above involves a problem that a precision of alignment between the blanket having the printing pattern formed thereon, and the substrate receiving the printing is low although the blanket and the reverse printing block are easy to tightly adhere because the blanket has the roll-like shape. On the other hand, in the second method described above, although it is possible to enhance the precision of the alignment between the blanket and the substrate receiving the printing, since the blanket, the reverse printing block, and the substrate receiving the printing all have the flat plate-like shapes, the bubble is easy to mix into a space defined between them, and thus the full surface tight adherence is difficult. From these factors, any of the existing methods involves a problem that the high-quality printing is difficult.

The present disclosure has been made in order to solve the problems described above, and it is therefore desirable to provide a bubble discharging structure with which high-quality printing can be carried out, a reverse printing block and a display device each including the bubble discharging structure, a printing method using the bubble discharging structure, and a method of manufacturing the display device.

In order to attain the desire described above, according to an embodiment of the present disclosure, there is provided a bubble discharging structure, including: a substrate which has a first area and a second area adjacent to the first area, and on which a counter substrate is caused to come in contact with the first area to provide a film having a first pattern; and a bubble discharging path through which the first area and the second area communicate with each other, and through which a bubble confined between the substrate and the counter substrate when the counter substrate is caused to come in contact with the first area is discharged from the first area to the second area.

According to another embodiment of the present disclosure, there is provided a reverse printing block, including: a substrate which has a printing area and a non-printing area adjacent to the printing area, and on which a blanket is caused to come in contact with the printing area to provide a film having a first pattern; a recessed portion having a second pattern reverse to the first pattern provided on the printing area of the substrate; and a bubble discharging path which is provided in the non-printing area and communicates with the recessed portion, and through which a bubble confined between the substrate and the blanket when the blanket is caused to come in contact with the printing area is discharged According to still another embodiment of the present disclosure, there is provided a display device, including: a substrate which has a display area and a non-display area adjacent to the display area, and on which a blanket is caused to come in contact with the display area to provide an organic film having a first pattern; pixels having the first pattern and provided in the display area of the substrate; and a bubble discharging path through which the display area and the non-display area communicate with each other, and through which a bubble confined between the substrate and the blanket when the blanket is caused to come in contact with the display area are discharged from the display area to the non-display area.

According to yet another embodiment of the present disclosure, there is provided a printing method, including: forming a transfer layer on a counter substrate; and pressing the transfer layer against a first area of a substrate having the first area and a second area adjacent to the first area, and provided with a bubble discharging path through which the first area and the second area communicate with each other to form a film having a first pattern on the first area, thereby discharging a bubble from the first area to the second area through the bubble discharging path.

According to a further embodiment of the present disclosure, there is provided a method of manufacturing a display device, including: forming display elements on a substrate. The process of forming of the display elements on the substrate includes forming a transfer layer on a counter substrate, and pressing the transfer layer against a first area of a substrate having the first area and a second area adjacent to the first area, and provided with a bubble discharging path through which the first area and the second area communicate with each other to form a film having a first pattern on the first area, thereby discharging a bubble from the first area to the second area through the bubble discharging path.

In the printing method, and the method of manufacturing a display device of the present disclosure, in pressing of the transfer layer formed on the blanket against the substrate, the bubble confined in the space defined between the substrate and the blanket is moved from the first area to the second area through the bubble discharging path. As a result, the substrate and the blanket are perfectly tightly adhered to each other in the first area, and thus the first or second pattern is precisely formed either on the substrate or on the blanket.

As set forth hereinabove, according to the present disclosure, since the bubble discharging path is provided between the first area and the second area, in printing using the flat plate-like blanket, the bubble confined in the space defined between the blanket and the substrate can be moved from the first area to the second area. Therefore, the precise pattern can be formed either on the transfer layer of the blanket or on the substrate, the high-quality printing can be carried out, and thus the bubble discharging structure can be suitably used in the manufacture of the display device such as an organic EL display device.

BRIEF DESCRIPTION OF THE DRAWINGS

FIGS. 18A and 18B are respectively views explaining processes for printing a red light emitting layer shown in FIG. 16;

FIG. 20 is a top plan view showing a structure of a substrate shown in FIGS. 17A and 17B according to Modification 6 of the second embodiment of the present disclosure;

FIGS. 26A to 26G are respectively a front view of a mobile phone as a fifth example of application, in an open state, to which the display device shown in FIG. 14 of the second embodiment is applied, a side elevational view thereof in the open state, a front view thereof in a close state, a left side elevational view thereof in the close state, a right side elevational view thereof in the close state, a top plan view thereof in the close state, and a bottom view thereof in the close state.

DETAILED DESCRIPTION OF THE PREFERRED EMBODIMENTS

Figure 1:
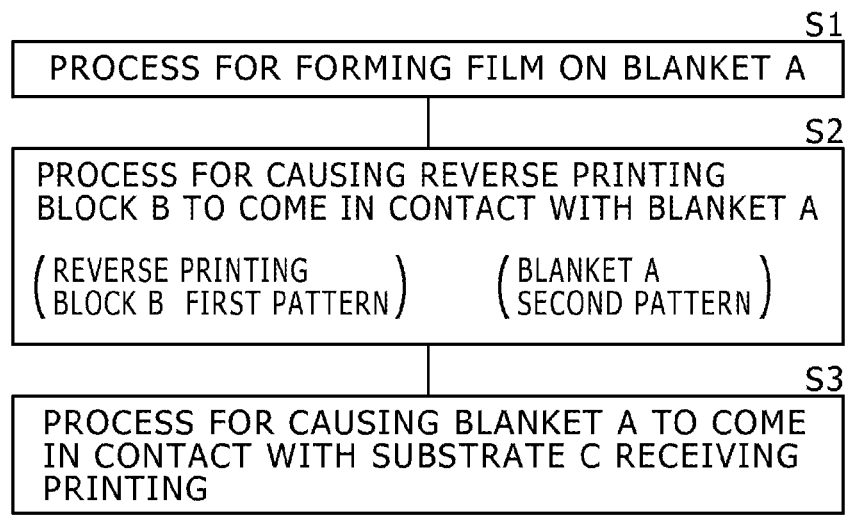
FIG. 1 is a flow chart explaining a series of printing processes of the present disclosure.

Embodiments of the present disclosure will be described in detail hereinafter with reference to the accompanying drawings. It is noted that the description will be given below in accordance with the following order:

1. Basic Concept;
2. First Embodiment;
A reverse printing block having a trench-like bubble discharging path
3. Modification 1;
A reverse printing block having plural bubble discharging paths
4. Modifications 2 to 4;
A reverse printing block having plural printing areas
5. Modification 5;
A reverse printing block having a hole-like bubble discharging path
6. Second Embodiment;
A display device having a trench-like bubble discharging path in a substrate
7. Modification 6; and
8. Module and Examples of Application.

1. Basic Concept

The basic concept of the present disclosure is such that when a substrate and a counter substrate are caused to come in contact with each other, thereby carrying out the transfer in a series of printing processes, a bubble confined in a space defined between the two sheets of substrate and counter substrate is discharged from an area in which a precise pattern is to be formed to an area other than the area described above through a bubble discharging path provided in the substrate. The printing is carried out through processes shown in FIG. 1. It is noted that in the following description, a blanket A corresponds to the counter substrate described above, and either a reverse printing block B (Step S2) or a substrate C receiving the printing (Step S3) corresponds to the substrate described above.

Firstly, a film for transfer is formed over the entire surface of the blanket A (Step S1). Next, the reverse printing block B is caused to come in contact with the blanket A (Step S2). Of the reverse printing block B, the central portion of a surface facing the blanket A is a printing area (first area), and the circumference adjacent to the printing area is a non-printing area (second area). Recessed portions having a stripe-like pattern (second pattern) are provided in the printing area. The reverse printing block B is caused to come in contact with the blanket A, whereby a film having a pattern (first pattern) of protruding portions reverse to the pattern of the recessed portions is formed on the reverse printing block B, and a film having a pattern corresponding to the recessed portions is formed on the blanket A. At this time, a bubble discharging path is provided between the printing area and the non-printing area of the reverse printing block B, thereby making it possible to form a precise pattern on the blanket A.

After the reverse printing block B has been caused to come in contact with the blanket A, the blanket A is caused to come in contact with a substrate C receiving the printing (Step S3). For example, the central portion of the substrate C receiving the printing is a display area (first area) in which pixels are formed in a matrix so as to have a pattern (first pattern), and the circumference adjacent to the display area is a non-display area (second area). The blanket A is caused to come in contact with the substrate C receiving the printing, whereby a film having the predetermined pattern formed on the blanket A in Step S2 is transferred onto the substrate C receiving the printing. At this time as well, the bubble discharging path is provided between the display area and the non-display area of the substrate C receiving the printing, thereby making it possible to form a precise pattern on the substrate C receiving the printing.

Hereinafter, the process in Step S2 will be concretely described as a first embodiment, while the process in Step S3 will be concretely described as a second embodiment.

2. First Embodiment

Structure of Reverse Printing Block 1

The reverse printing block (the reverse printing block 1) according to the first embodiment of the present disclosure is applied to an offset reverse printing system using a flat plate-like blanket, and a structure thereof will be described below with reference to FIG. 2, FIGS. 3A and 3B, and FIGS. 4A and 4B.

Figure 2:
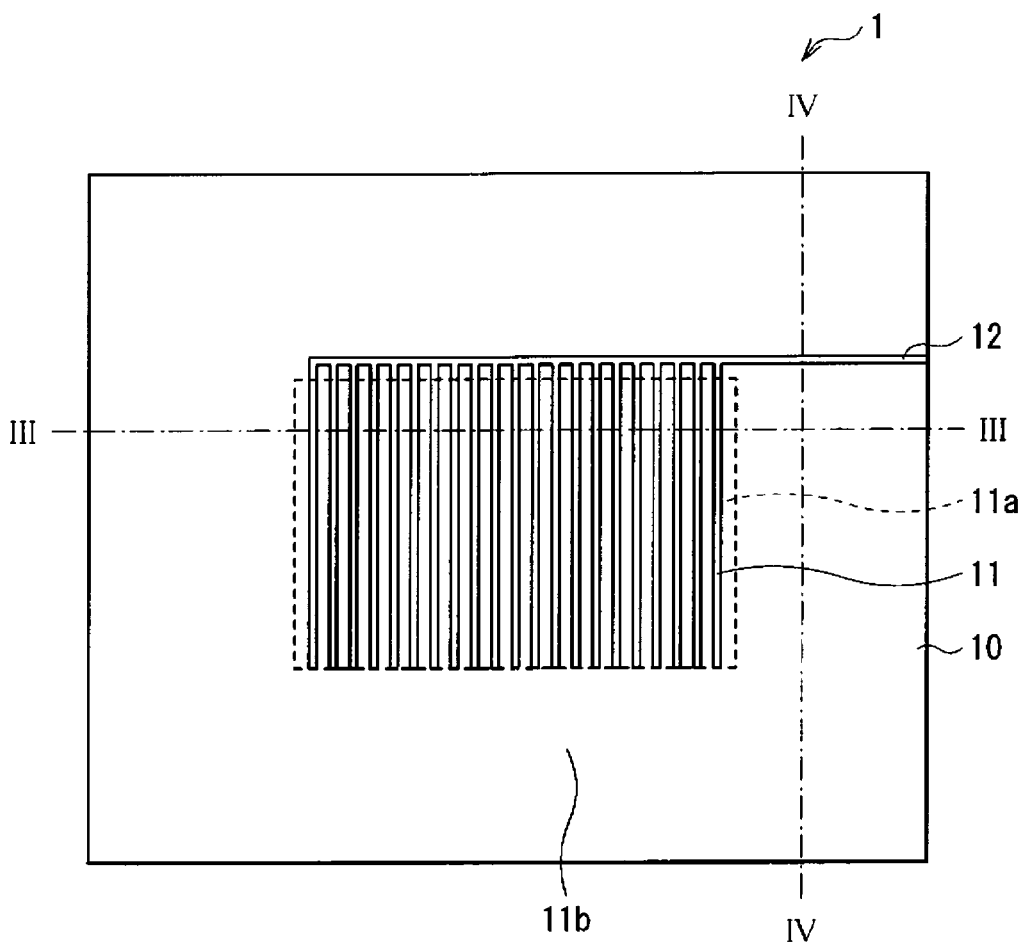
FIG. 2 is a top plan view showing a structure of a reverse printing block according to a first embodiment of the present disclosure.

FIG. 2 shows a planar structure of the reverse printing block 1. The reverse printing block 1 has a printing area 11a (first area) on a surface of a substrate 10, for example, at the central portion of the surface of the substrate 10. Also, an area, other than the printing area 11a, adjacent to the printing area 11a is defined as a non-printing area 11b (second area). The non-printing area 11b is disposed so as to surround the printing area 11a. A recessed portion 11 which has a predetermined pattern (second pattern) and which is used to form a transfer layer (a transfer layer 32C shown in FIGS. 6A to 6G which will be described later) having the predetermined pattern (second pattern) on a flat plate-like blanket (a counter substrate, for example, a blanket 31 shown in FIGS. 6A to 6G which will be described later) is provided in the printing area 11a.

On the other hand, a trench-like bubble discharging path 12 is provided in the non-printing area 11b. The trench-like bubble discharging path 12 extends up to an end portion of the substrate 10 and has an opening portion in one side of the substrate 10. One end of the recessed portion 11 extends up to the non-printing area 11b to communicate with the bubble discharging path 12. That is to say, the recessed portion 11 of the printing area 11a is opened to the atmosphere through the bubble discharging path 12.

The substrate 10 is made of either an inorganic material such as a glass or silicon, or a metal such as copper or nickel. The recessed portion 11, for example, is formed by carrying out mechanical processing, wet etching, dry etching, laser processing or the like for the substrate 10.

Figure 5:
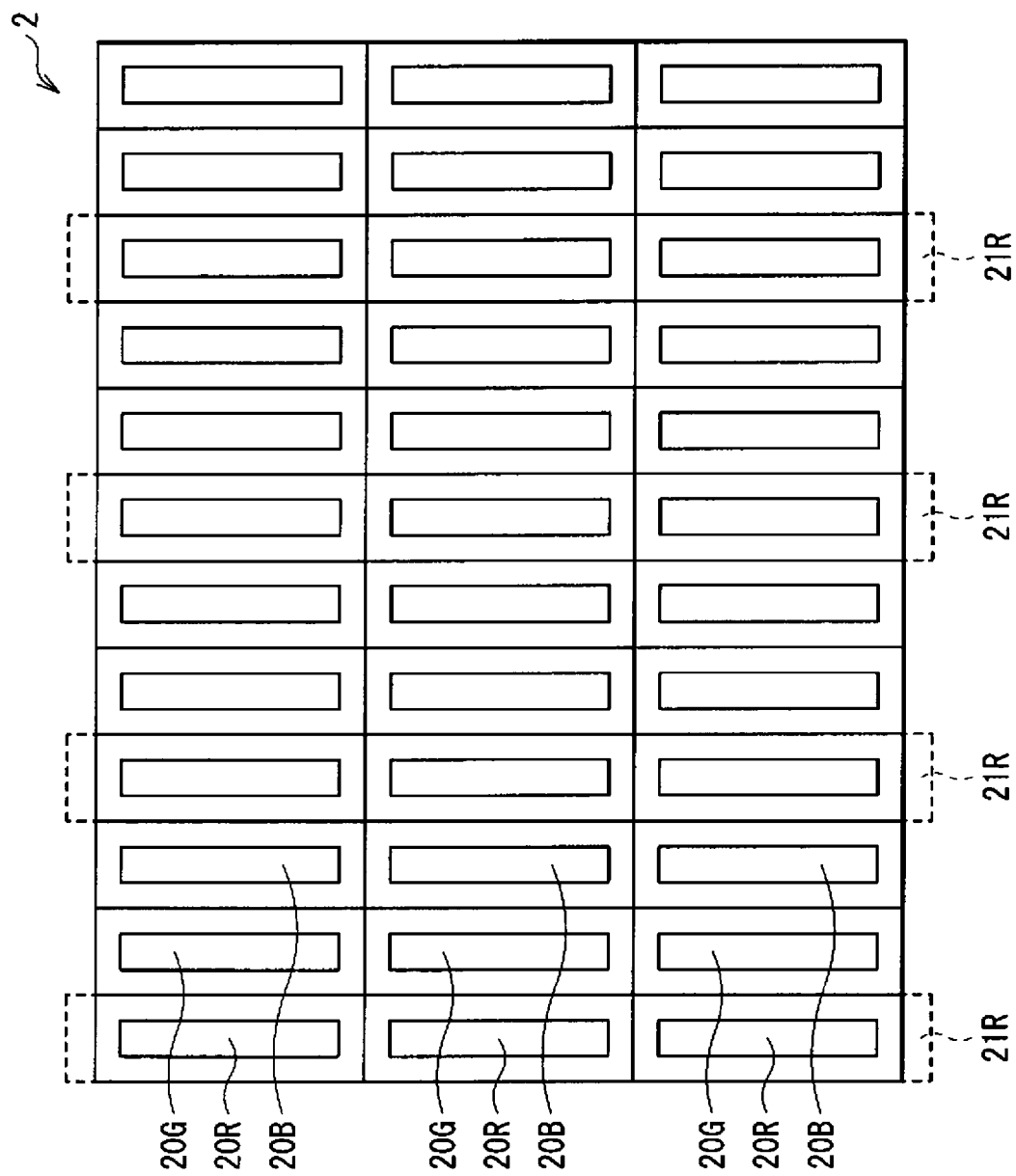
FIG. 5 is a top plan view explaining a pattern of a recessed portion of the reverse printing block shown in FIG. 2.

A shape of the recessed portion 11 corresponds to a pattern which is intended to be printed on the substrate receiving the printing. In this case, for example, plural stripe-like patterns are formed so as to correspond to a printing pattern of a TFT substrate 34 (refer to FIGS. 6D to 6G). For example, in the case of a display device 2 shown in FIG. 5, a red color pixel 20R, a green color pixel 20G, and a blue color pixel 20B are disposed in one direction in order. However, when a red light emitting layer is desired to be printed, a stripe-like red color pattern 21R, and a pattern of the recessed portion 11 correspond to each other. The printing area 11a corresponds to an area which is intended to be printed on the substrate receiving the printing, for example, an area (display area) in which the pixels shown in FIG. 5 are formed.

The bubble discharging path 12 provided in the non-printing area 11b, for example, extends in a direction perpendicular to the recessed portions 11 each extending in one direction so as to communicate with one ends of all of the recessed portions 11. As a result, in the first embodiment, when the reverse printing block 1 is pressed against the flat plate-like blanket, the bubble confined in the printing area 11a is moved to the non-printing area 11b through the recessed portions 11, and are then discharged from the end portion of the substrate 10 to the atmosphere through the bubble discharging path 12. The bubble which has been discharged to the atmosphere is not returned back to the printing area 11a again at all. Similarly to the case of the recessed portion 11, for example, the bubble discharging path 12 can be formed by carrying out the etching processing such as wet etching or dry etching, dicing processing or the laser processing for the substrate 10. It is noted that the shape of the bubble discharging path 12 is by no means limited to the shape shown in FIG. 2 and, for example, the recessed portion 11 either may be made to sufficiently extend to the non-printing area 11b, or may be made to extend up to the end portion of the substrate 10 to communicate with the atmosphere, thereby being formed as the bubble discharging path.

Figure 3A:
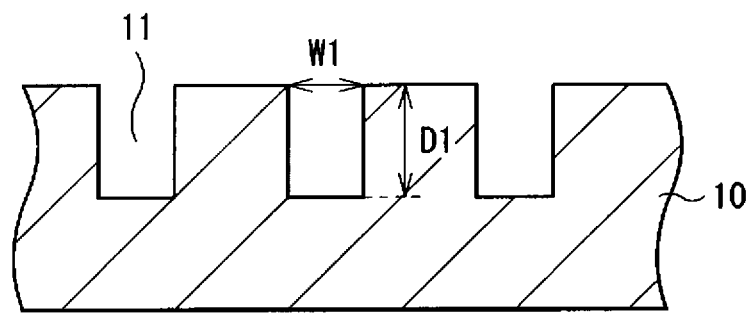
FIGS. 3A and 3B are respectively partial cross sectional views each taken on line III-III of FIG. 2.
Figure 3B:
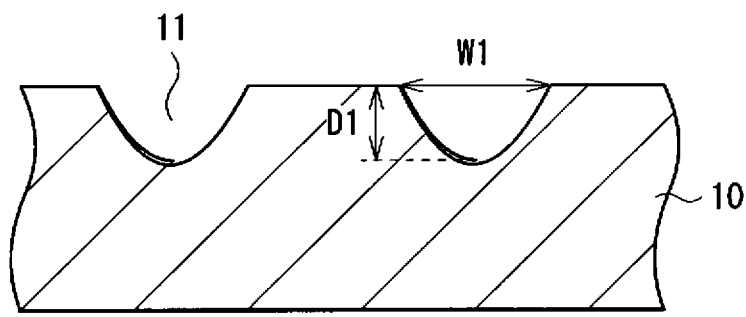
Figure 4A:
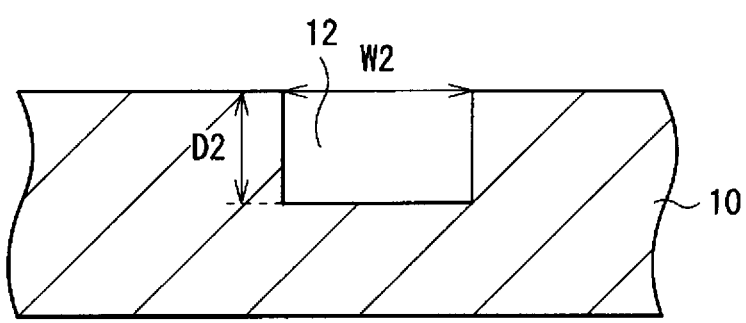
FIGS. 4A and 4B are respectively partial cross sectional views each taken on line IV-IV of FIG. 2.
Figure 4B:
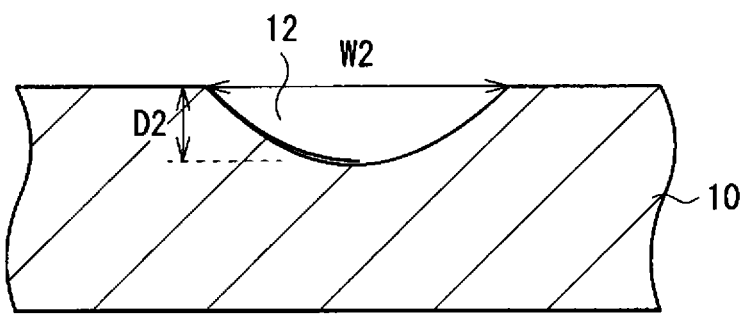

FIGS. 3A and 3B are respectively partial cross sectional views of the cross-sectional structures each taken on line III-III of FIG. 2, and show the cross sections of the recessed portion 11. Also, FIGS. 4A and 4B are respectively partial cross sectional views of the cross-sectional structures each taken on line IV-IV of FIG. 2, and show the cross sections of the bubble discharging path 12. The shapes of the recessed portion 11 and the bubble discharging path 12 either may be schematic rectangular shapes as shown in FIG. 3A and FIG. 4A, respectively, or may be schematic semicircular shapes as shown in FIG. 3B and FIG. 4B, respectively. A depth D1 of the recessed portion 11 and a depth D2 of the bubble discharging path 12 either may be identical to each other or may be different from each other. For example, the depth D1 of the recessed portion 11 is set in the range of 3 to 10 μm, and the depth D2 of the bubble discharging path 12 is also set in the range of 3 to 10 μm. When as described above, the recessed portion 11 and the bubble discharging path 12 are each formed by carrying out the etching processing, preferably, the depth D1 and the depth D2 are identical to each other. The reason for this is because the bubble discharging path 12 can be provided in the process common to the recessed portion 11.

Likewise, a width W1 of the recessed portion 11, and a width W2 of the bubble discharging path 12 either may be identical to each other or may be different from each other. Normally, in consideration of the alignment precision as well in the phase of the printing, for example, the width W1 of the recessed portion 11 is made to have a size slightly larger than a width of the red color pixel 20R. Although there is not especially a restriction to the width W2 of the bubble discharging path 12, preferably, the width W2 is larger than the width W1 so that the bubble is readily discharged to the bubble discharging path 12. The width W2 of the bubble discharging path 12 may not be uniform or the bubble discharging path 12 may have a shape which is widened toward the end portion of the substrate 10. Operation and effects of reverse printing block 1

Next, a printing method using the reverse printing block 1 will be described in detail with reference to FIGS. 6A to 6G, and an operation and effects of the reverse printing block 1 will be described in conjunction with the printing method using the reverse printing block 1.

Figure 6A:
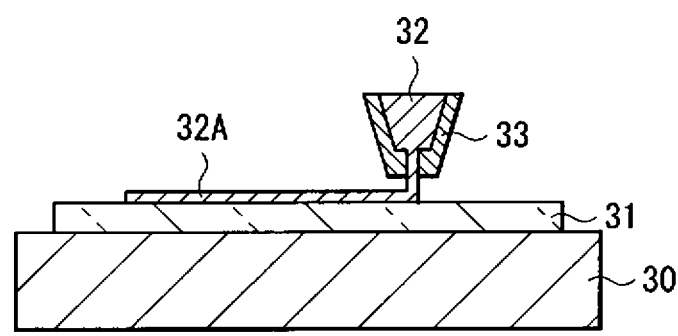
FIGS. 6A to 6G are respectively cross sectional views explaining processes of a printing method utilizing a reverse offset printing system using the reverse printing block shown in FIG. 2.

Firstly, as shown in FIG. 6A, a flat plate-like blanket 31 is fixed on a stage 30. Then, an ink 32 is applied to the flat plate-like blanket 31 by using a slit coating head 33, thereby forming a transfer layer 32A on the blanket 31. The transfer layer 32A may also be formed by utilizing a spin coating system instead of utilizing the slit coating system. For the purpose of obtaining the satisfactory contact with a substrate receiving printing (a TFT substrate 34 which will be described later), the blanket 31 is made of a deformable material which is rich in flexibility. Specifically, for example, a material which is formed in such a way that either a silicon rubber or a fluororesin is deposited on a base material made of a resin film, a glass, a metal or the like by utilizing either the spin coating system or the slit coating system, and is then fired is used as the material for the blanket 31. The ink 32 is obtained by mixing a resin, metallic powder or an oxide becoming a material for a color filter or a material for a light emitting layer in an organic EL display device with about 0.1 to about 90 w % of low polarity solvent. For example, poly (2-methoxy-5-(2'-ethylhexyloxy)1,4-phenylenevinylene) can be used as the material for the light emitting layer in the organic EL display device. Also, a straight-chain alkane class, an aromatic hydrocarbon class, an ether class, an alkyl halide class, an ester compound, a cyclic ether compound or a mixture thereof can be used as the low polarity solvent.

Figure 6B:
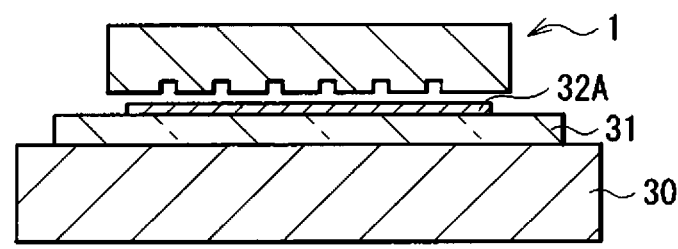
Figure 6C:
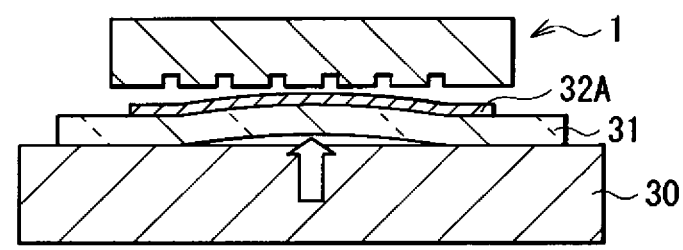

Next, as shown in FIG. 6B, after the reverse printing block 1 and the blanket 31 have been aligned with each other, as shown in FIG. 6C, the transfer layer 32A is pressed against the printing area 11a of the reverse printing block 1. The process for causing the transfer layer 32A (the blanket 31) to come in contact with the reverse printing block 1 is caused by carrying out a pressed compression, that is, by ejecting and pushing out a compressed gas from a back surface side of the blanket 31 to successively tightly adhere the transfer layer 32A to the reverse printing block 1 from the central portion (the printing area 11a) to the end portion (the non-printing area 11b) (compressed gas pressing method).

Figure 6D:
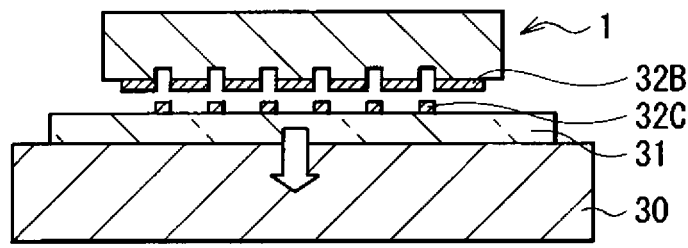

After that, as shown in FIG. 6D, when the blanket 31 is kept away from the reverse printing block 1, a non-printing portion 32B having a pattern (first pattern) reverse to the pattern of the recessed portion 11, that is, corresponding to protruding portions is transferred onto the reverse printing block 1. At the same time, a transfer layer 32C having a pattern (second pattern) corresponding to the recessed portions 11 of the reverse printing block 1 is formed on the blanket 31.

Figure 6E:
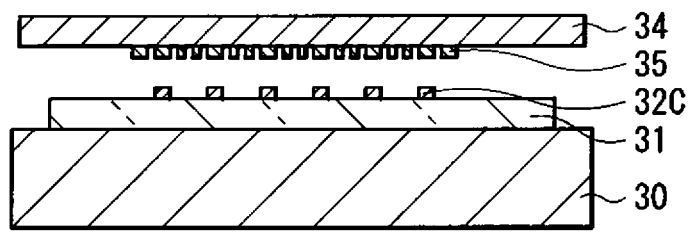
Figure 6F:
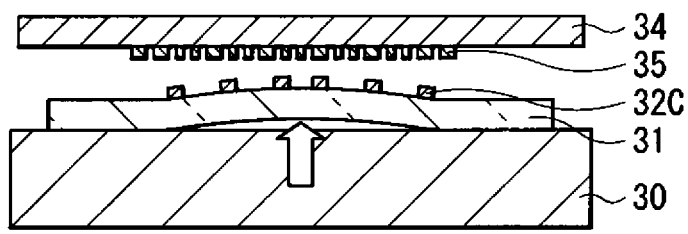

Next, as shown in FIG. 6E, after the blanket 31 has been aligned with the TFT substrate 34 (the substrate receiving the printing) in such a way that the transfer layer 32C of the blanket 31 faces electrodes 35 of the TFT substrate 34, as shown in FIG. 6F, both of the blanket 31 and the TFT substrate 34 are caused to come in contact with each other. The contact between the blanket 31 and the TFT substrate 34 is carried out by the pressed compression described above.

Figure 6G:
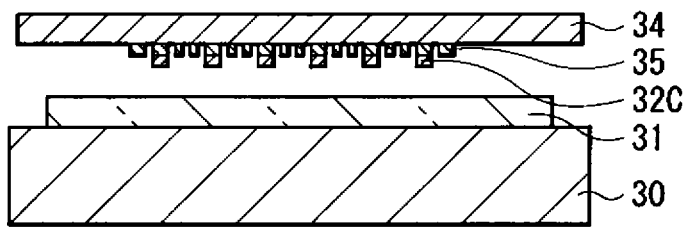

Finally, as shown in FIG. 6G, when the blanket 31 is kept away from the TFT substrate 34, the transfer layer 32C is printed on the TFT substrate 34.

Figure 7A:
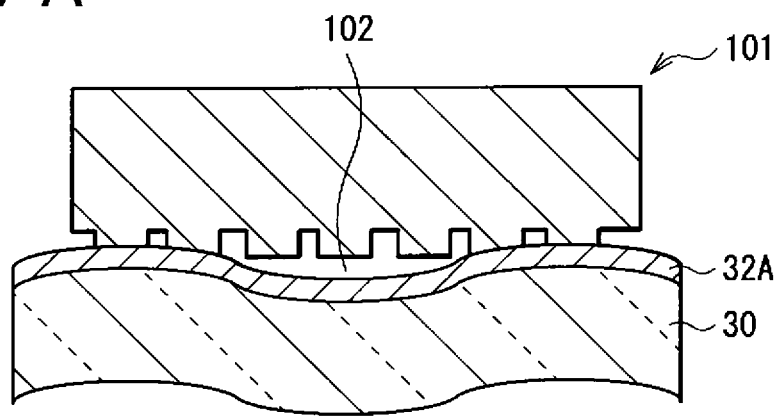
FIGS. 7A and 7B are respectively a partial cross sectional view and a perspective view explaining the case where the printing is carried out by using a reverse printing block according to a comparative example of the first embodiment.
Figure 7B:
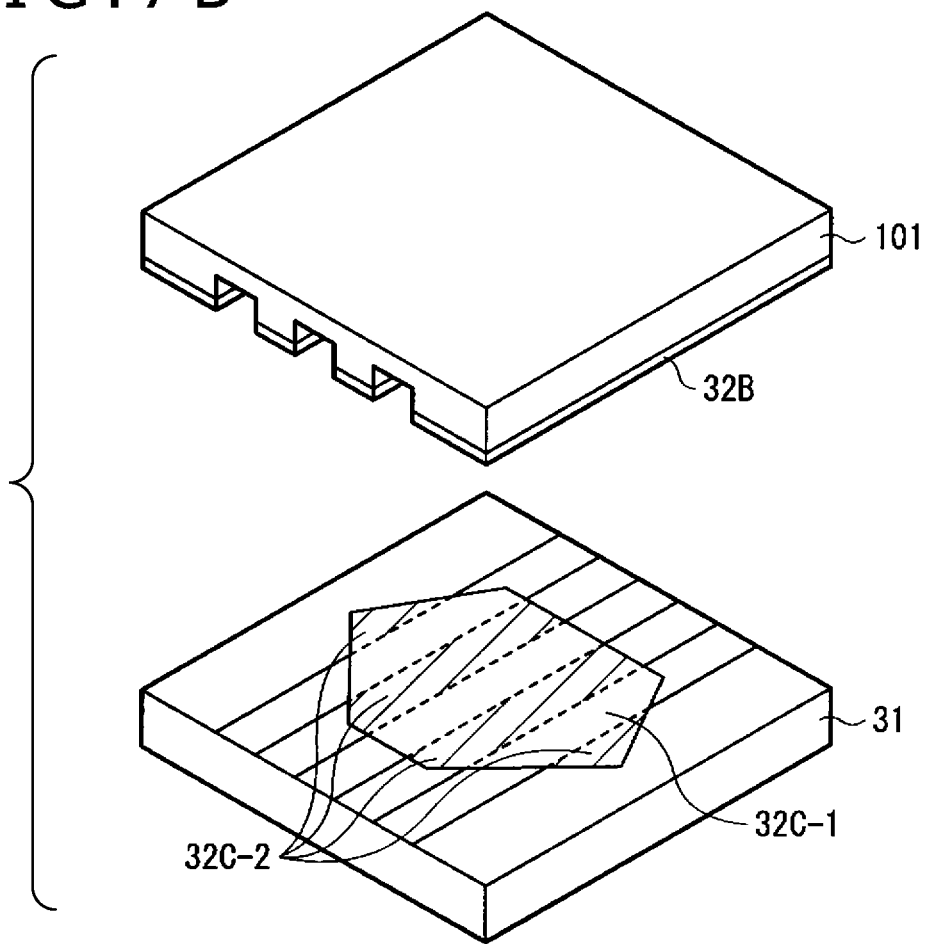

Here, the characteristic portion of the printing method using the reverse printing block of the first embodiment will be described in detail while reference is made to a comparative example of the first embodiment. FIGS. 7A and 7B show the case where a reverse printing block 101 in which no bubble discharging path 12 is provided, and the flat plate-like blanket 31 on which the transfer layer 32A is deposited are tightly adhered to each other as the comparative example. FIG. 7A is a partial cross sectional view (corresponding to FIG. 6C) in the phase of the contact between the reverse printing block 101 and the flat plate-like blanket 31. Also, FIG. 7B is a perspective view showing the transfer layer 32B formed on the flat plate-like blanket 31 after completion of the contact (corresponding to FIG. 6D). As shown in FIG. 7A, a bubble 102 is confined in a space defined between the reverse printing block 101 and the flat plate-like blanket 31 both having the flat plate-like shapes with high frequency. Since in the area containing the bubble 102 existing therein, the transfer layer 32A on the blanket 31 is not transferred onto the reverse printing block 101, as shown in FIG. 7B, a bubble confining area 32C-1 having a shape of the bubble 102 exists in the transfer layer 32B. That is to say, since a non-transfer portion 32C-2 as a portion other than the stripe-like pattern is left on the blanket 31, and the non-transfer portion 32C-2 is printed on the substrate receiving the printing, the precise pattern becomes difficult to print.

In contrast with the comparative example described above, the reverse printing block 1 of the first embodiment has the bubble discharging path 12 in the non-printing area 11b. Thus, the bubble confined in the printing area 11a is discharged from the non-printing area 11b to the atmosphere through the bubble discharging path 12.

Figure 8A:
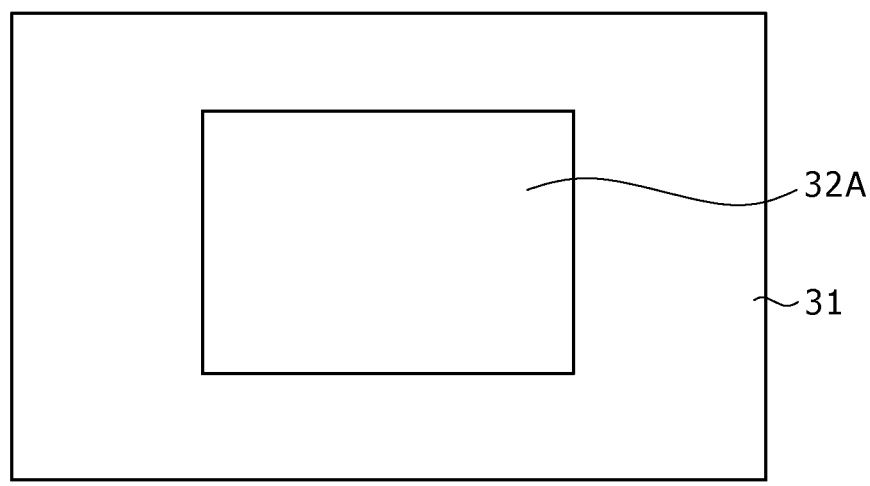
FIGS. 8A and 8B are respectively top plan views explaining the case where the printing is carried out by using the reverse printing block shown in FIG. 2.
Figure 8B:
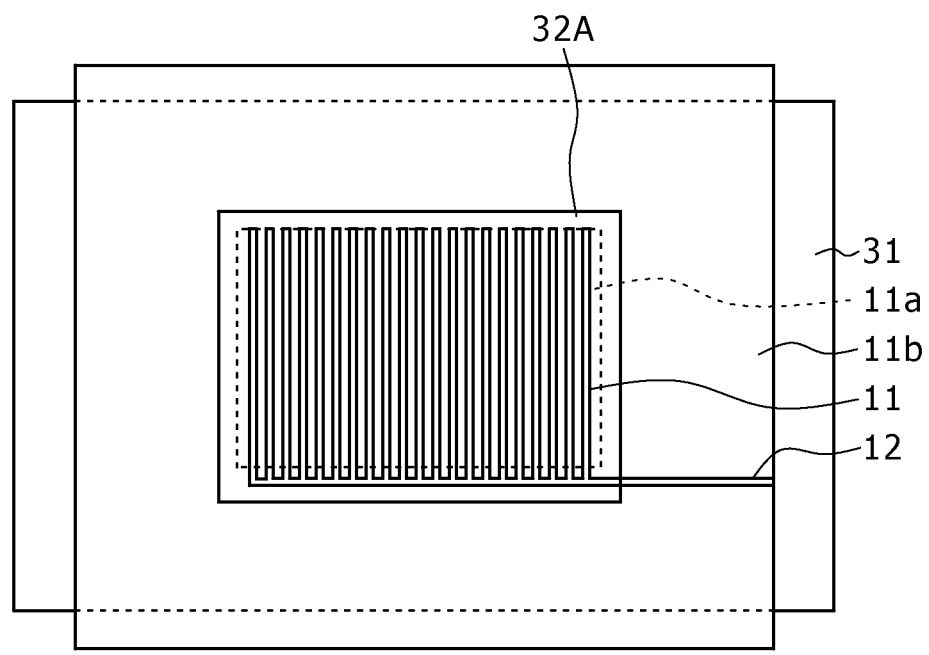

FIG. 8A is a top plan view showing a planar structure of the blanket 31 on which the transfer layer 32A is deposited, and FIG. 8B is a top plan view showing a planar structure when the reverse printing block 1 of the first embodiment is tightly adhered to the blanket 31 shown in FIG. 8A (corresponding to FIG. 6C). In the reverse printing block 1, the recessed portion 11 having the predetermined pattern extends to the non-printing area 11b to communicate with the bubble discharging path 12. As a result, even if the bubble is confined in the space defined between the blanket 31 and the reverse printing block 1 when the blanket 31 and the reverse printing block 1 are tightly adhered to each other, the bubble is moved to the non-printing area 11b through the recessed portion 11 and the bubble discharging path 12 by applying the pressing force and is then discharged from the end portion of the substrate 10 to the atmosphere.

As has been described, in the first embodiment, the bubble discharging path 12 is provided in the non-printing area 11b of the reverse printing block 1. Therefore, when the reverse printing block 1 is pressed against the blanket 31, the bubble confined in the space defined between the blanket 31 and the reverse printing block 1 is automatically moved from the printing area 11a to the non-printing area 11b and is then discharged to the atmosphere. Therefore, the precise pattern can be formed on the blanket 31 without requiring any of complicated mechanisms.

In addition, since the blanket and the reverse printing block are made of materials each having high smoothness, respectively, in most cases, the blanket and the reverse printing block are strongly, tightly adhered to each other in a state close to the vacuum. For this reason, in the process for keeping the blanket and the reverse printing block from each other (corresponding to FIG. 6D), the blanket and the reverse printing block are successively peeled off from each other while the air is gradually introduced from the end portion. However, since the blanket and the reverse printing block are strongly, tightly adhered to each other, a deformation or crack is caused in both of the reverse printing block and the base of the blanket due to the excessive load in some cases. On the other hand, since the bubble discharging path 12 provided in the reverse printing block 1 has the opening portion in the end portion of the substrate 10, the air can be readily introduced into the space defined between the blanket 31 and the reverse printing block 1. Therefore, the force required for the detachment can be reduced, and thus the damage of the reverse printing block and the blanket can be prevented.

In addition, although in the first embodiment described above, the reverse printing block 1 is caused to come in contact with the blanket 31 by the pressed compression, in the reverse printing block 1, the bubble confined in the space defined between the reverse printing block 1 and the blanket 31 is readily discharged to the non-printing area 11b through the bubble discharging path 12. Therefore, the blanket 31 and the reverse printing block 1 can also be pressed against each other by using only an elastic body such as a sponge instead of using the pressed compression. That is to say, the blanket 31 and the reverse printing block 1 can be tightly adhered to each other by using the simple mechanism, and thus the apparatus cost required for the printing can be suppressed.

Although Modifications of the first embodiment and other embodiments will be described in detail hereinafter, in the following description, the same constituent portions as those of the first embodiment are designated by the same reference numerals or symbols, respectively, and a description thereof is suitably omitted here for the sake of convenience.

3. Modification 1

Figure 9:
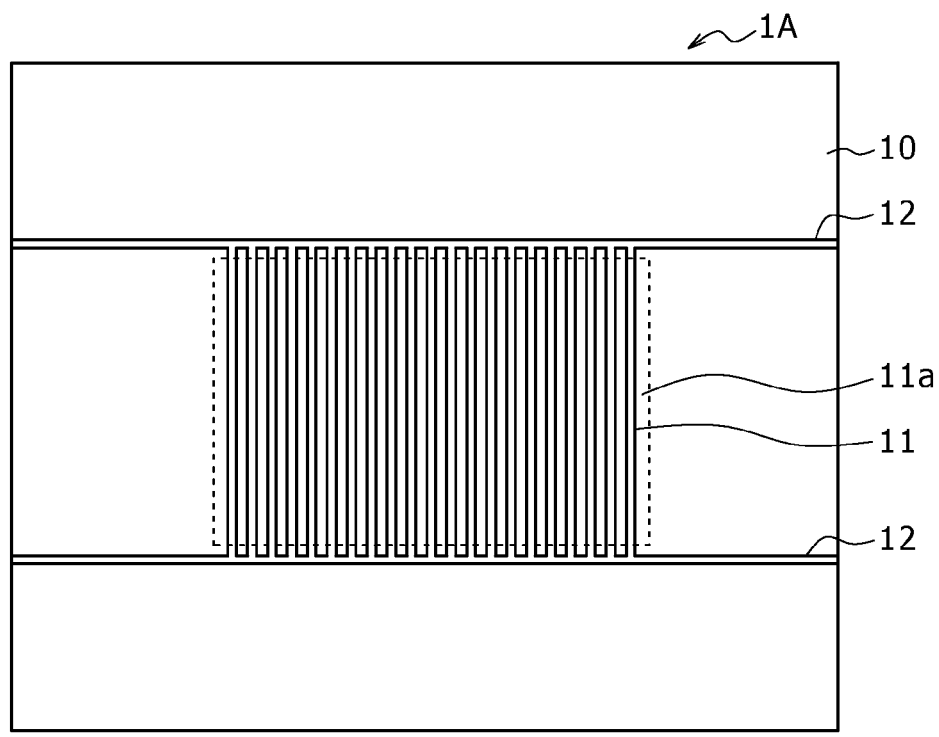
FIG. 9 is a top plan view showing a structure of a reverse printing block according to Modification 1 of the first embodiment of the present disclosure.

FIG. 9 is a top plan view showing a structure of a reverse printing block (a reverse printing block 1A) according to Modification 1 of the first embodiment. In the reverse printing block 1A, plural bubble discharging paths (two bubble discharging paths 12 in FIG. 9) are provided. Except for this point, the reverse printing block 1A has the same structure as that of the reverse printing block 1 of the first embodiment, and the operation and effects of the reverse printing block 1A are the same as those of the reverse printing block 1 of the first embodiment.

The reverse printing block 1A is structured in such a way that, for example, the bubble discharging paths 12 communicate with both ends of the recessed portions 11 each having a stripe-like pattern, respectively. As has been described, the plural bubble discharging paths 12 are provided, whereby the bubble confined in the space defined between the reverse printing block 1A and the blanket 31 when the reverse printing block 1A is tightly adhered to the blanket 31 is more readily moved to the non-printing area 11b. Also, when the reverse printing block 1A is kept away from the blanket 31, the air becomes easier to introduce into the space defined between the reverse printing block 1A and the blanket 31. It is noted that although in FIG. 9, the two bubble discharging paths 12 are each provided in the direction perpendicular to the extension direction of each of the recessed portions 11, three or more bubble discharging paths 12 may be provided, and the bubble discharging paths 12 may be each provided in the same direction or in an oblique direction with respect to the recessed portions 11.

4. Modifications 2 to 4

Modification 2

Figure 10:
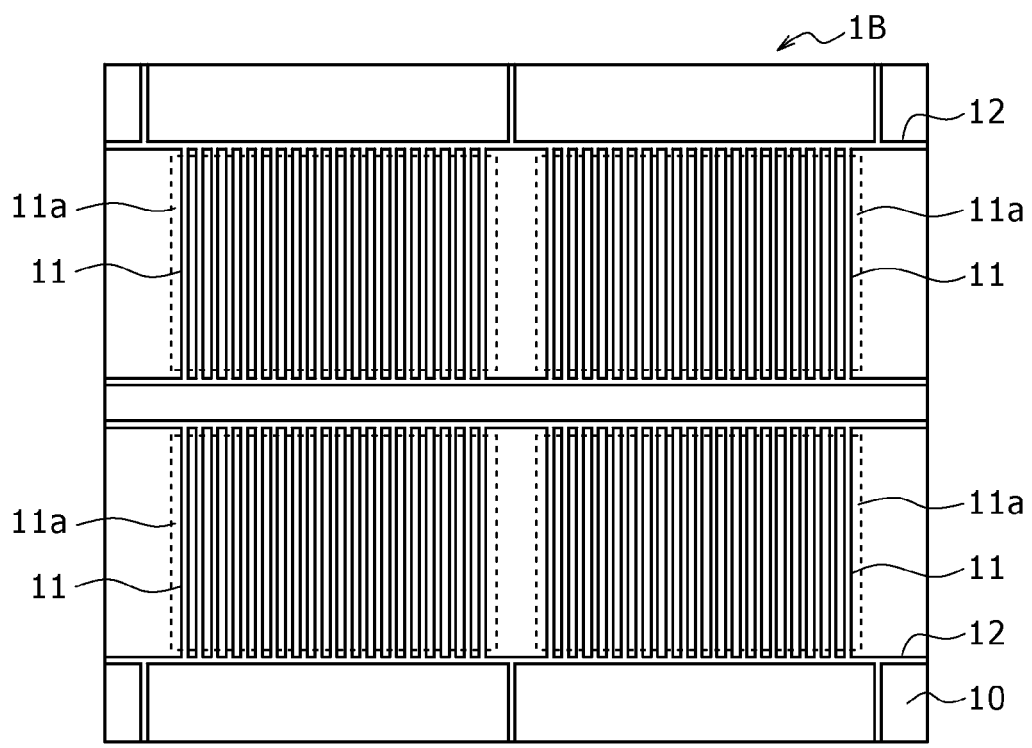
FIG. 10 is a top plan view showing a structure of a reverse printing block according to Modification 2 of the first embodiment of the present disclosure.

FIG. 10 is a top plan view showing a structure of a reverse printing block (a reverse printing block 1B) according to Modification 2 of the first embodiment. The reverse printing block 1B is provided with plural printing areas 11a (four printing areas 11a in FIG. 10), and thus is a reverse printing block having so-called multi-surface patterns. Except for this point, the reverse printing block 1B has the same structure as that of the reverse printing block 1 of the first embodiment, and the operation and effects of the reverse printing block 1B are the same as those of the reverse printing block 1 of the first embodiment.

In the reverse printing block 1B, for example, each adjacent two printing areas 11a of the four printing areas 11a are provided along two sides of the flat plate-like substrate 10 facing each other, respectively. The recessed portions 11 within all of the printing areas 11a are formed in the same direction, and the bubble discharging paths 12, for example, communicate with the both ends of the recessed portions 11, respectively. The bubble discharging paths 12 are provided in the direction perpendicular to each of the recessed portions 11. Thus, in the printing areas 11a adjacent to each other in the extension direction of each of the bubble discharging paths 12, the mutual recessed portions 11 communicate with each other through the bubble discharging paths 12. That is to say, even the case of the reverse printing block having the multi-surface patterns, the recessed portions 11 within the printing area 11a can communicate with one another, and also the common bubble discharging paths 12 can be provided. In addition thereto, in the reverse printing block 1B, of the bubble discharging paths 12, the two common bubble discharging paths 12 located on the outside (on the end portion side of the substrate 10), for example, branch off in the directions perpendicular to each other to reach the end portions of the substrate 10. Therefore, as compared with the case of no branching, the number of portions communicating with the atmosphere increases, and thus the effect of the bubble discharge and the air introduction is further enhanced.

Modification 3

Figure 11:
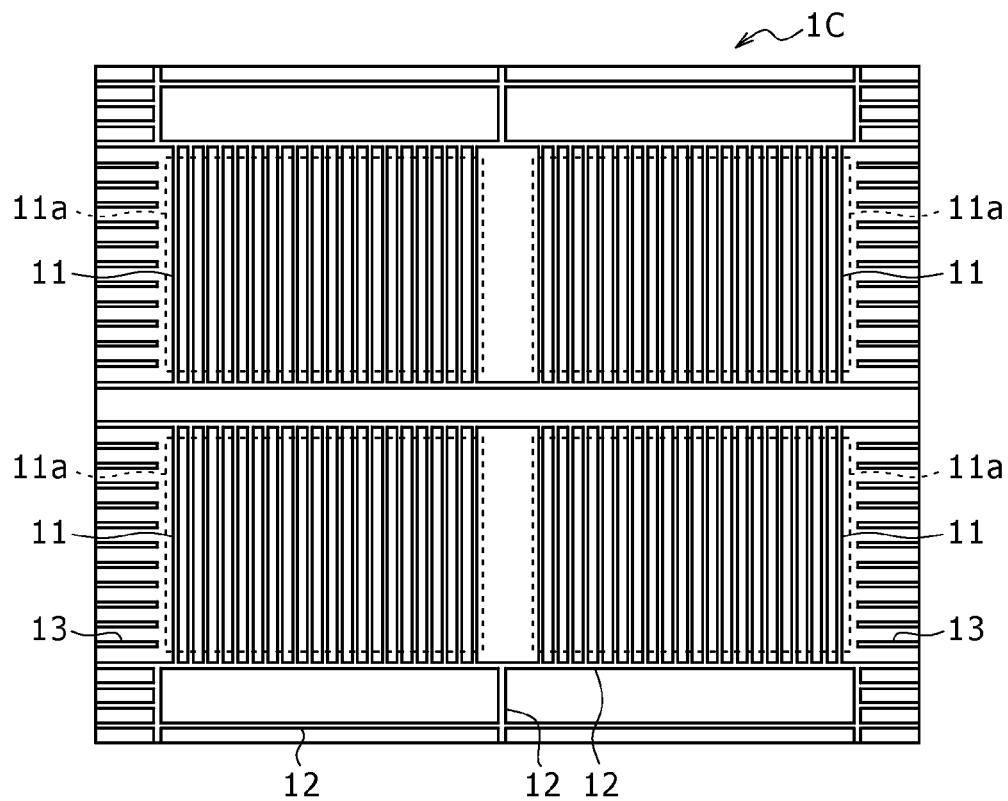
FIG. 11 is a top plan view showing a structure of a reverse printing block according to Modification 3 of the first embodiment of the present disclosure.

FIG. 11 is a top plan view showing a structure of a reverse printing block (a reverse printing block 1C) according to Modification 3 of the first embodiment. In the reverse printing block 1C, in addition to the bubble discharging portions 12, plural trench-like air introducing paths 13 are provided in the end portions of the substrate 10. Also, similarly to the case of the reverse printing block 1B, the reverse printing block 1C is the reverse printing block having the multi-surface patterns. Except for this point, the reverse printing block 1C has the same structure as that of the reverse printing block 1 of the first embodiment, and the operation and effects of the reverse printing block 1C are the same as those of the reverse printing block 1 of the first embodiment.

The trench-like air introducing paths 13 may not communicate with the recessed portions 11 as long as the trench-like air introducing paths 13 have opening portions at the ends of the substrate 10 to communicate with the atmosphere. The provision of such air introducing paths 13 results in that after the reverse printing block 1C has been caused to come in contact with the blanket 31 having the transfer layer 32A deposited thereon, the air is more readily introduced into the space defined between the reverse printing block 1C and the blanket 31 when the reverse printing block 1C and the blanket 31 are kept away from each other. Many air introducing paths 13 are preferably provided in the range of not influencing the printing area 11a.

Modification 4

Figure 12:
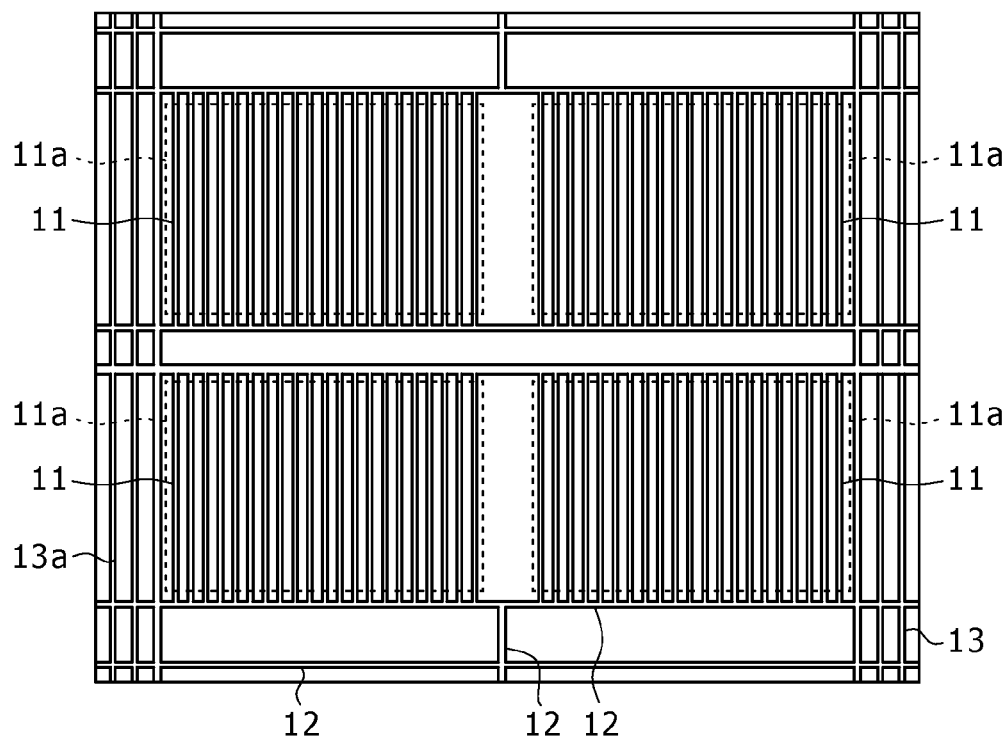
FIG. 12 is a top plan view showing a structure of a reverse printing block according to Modification 4 of the first embodiment of the present disclosure.

FIG. 12 is a top plan view showing a structure of a reverse printing block (a reverse printing block 1D) according to Modification 4 of the first embodiment. In the reverse printing block 1D, plural air introducing paths 13a are provided in a direction identical to the extension direction of each of the recessed portions 11. In addition, similarly to the case of the reverse printing block 1B, the reverse printing block 1D is the reverse printing block having multi-surface patterns. Except for this point, the reverse printing block 1D has the same structure as that of the reverse printing block 1 of the first embodiment, and the operation and effects of the reverse printing block 1D are the same as those of the reverse printing block 1 of the first embodiment.

The trench-like air introducing paths 13a, for example, may not communicate with the recessed portions 11 as long as the trench-like air introducing paths 13 have opening portions at the ends of the substrate 10 to communicate with the atmosphere. Each of the air introducing paths 13a, for example, is formed across one side of the substrate 10, and has the opening portions in sides facing each other of the substrate 10. Each of the air introducing paths 13a is preferably formed in a direction in which the blanket 31 and the reverse printing block 1D are kept away from each other after the blanket 31 and the reverse printing block 1D have been caused to come in contact with each other. In particular, when the recessed portion 11 in the plural printing areas 11a are formed in the same direction, the blanket 31 and the reverse printing block 1D are preferably kept away from each other along each of the recessed portions 11. Therefore, the extension direction of each of the recessed portions 11 and the extension direction of each of the air introducing paths 13a are preferably identical to each other. As a result, the air is more readily introduced into the space defined between the reverse printing block 1D and the blanket 31 when the reverse printing block 1D and the blanket 31 are kept away from each other.

5. Modification 5

Figure 13:
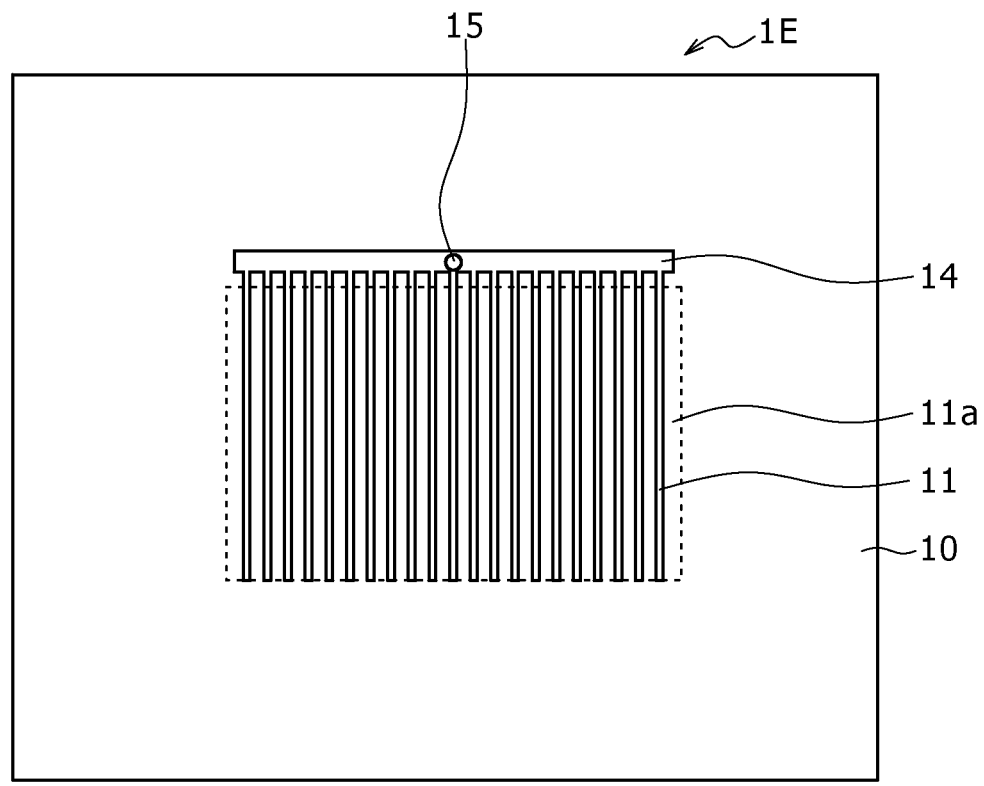
FIG. 13 is a top plan view showing a structure of a reverse printing block according to Modification 5 of the first embodiment of the present disclosure.

FIG. 13 is a top plan view showing a structure of a reverse printing block (a reverse printing block 1E) according to Modification 5 of the first embodiment. The reverse printing block 1E has a trench-like recessed portion communicating path 14 which, for example, is formed so as to communicate with one ends of the recessed portions 11. Also, the reverse printing block 1E has a hole-like bubble discharging path 15 which completely extends across the thickness direction of the substrate 10 within the recessed portion communicating path 14. That is to say, the hole-like bubble discharging path 15 is provided instead of providing the trench-like bubble discharging path 12 in the reverse printing block 1. Except for this point, the reverse printing block 1E has the same structure as that of the reverse printing block 1 of the first embodiment, and the operation and effects of the reverse printing block 1E are the same as those of the reverse printing block 1 of the first embodiment.

The recessed portion communicating path 14, for example, extends in the direction perpendicular to each of the recessed portions 11 so as to communicate with the one ends of all of the recessed portions 11. The hole-like bubble discharging path 15 is provided in an inner wall of the recessed portion communicating path 14, and perfectly extends across the thickness direction of the substrate 10 to communicate with the atmosphere. That is to say, each of the recessed portions 11 communicates with the atmosphere through both of the recessed portion communicating path 14 and the bubble discharging path 15. As a result, the bubble which is confined in the space defined between the blanket 31 and the reverse printing block 1E when the blanket 31 and the reverse printing block 1E are tightly adhered to each other is discharged to the atmosphere through both of the recessed portion communicating path 14 and the bubble discharging path 15. It is noted that the bubble discharging path 15 can be formed by carrying out the etching processing such as the wet etching or the dry etching, or the laser processing for the substrate 10. Although in FIG. 13, the recessed portion communicating path 14 is provided and one bubble discharging path 15 is formed in the recessed portion communicating path 14, plural bubble discharging paths 15 may be formed, or instead of providing the recessed portion communicating path 14, the bubble discharging path 15 may be directly provided in each of the recessed portions 11 extending to the outside of the printing area 11a.

6. Second Embodiment

Figure 14:
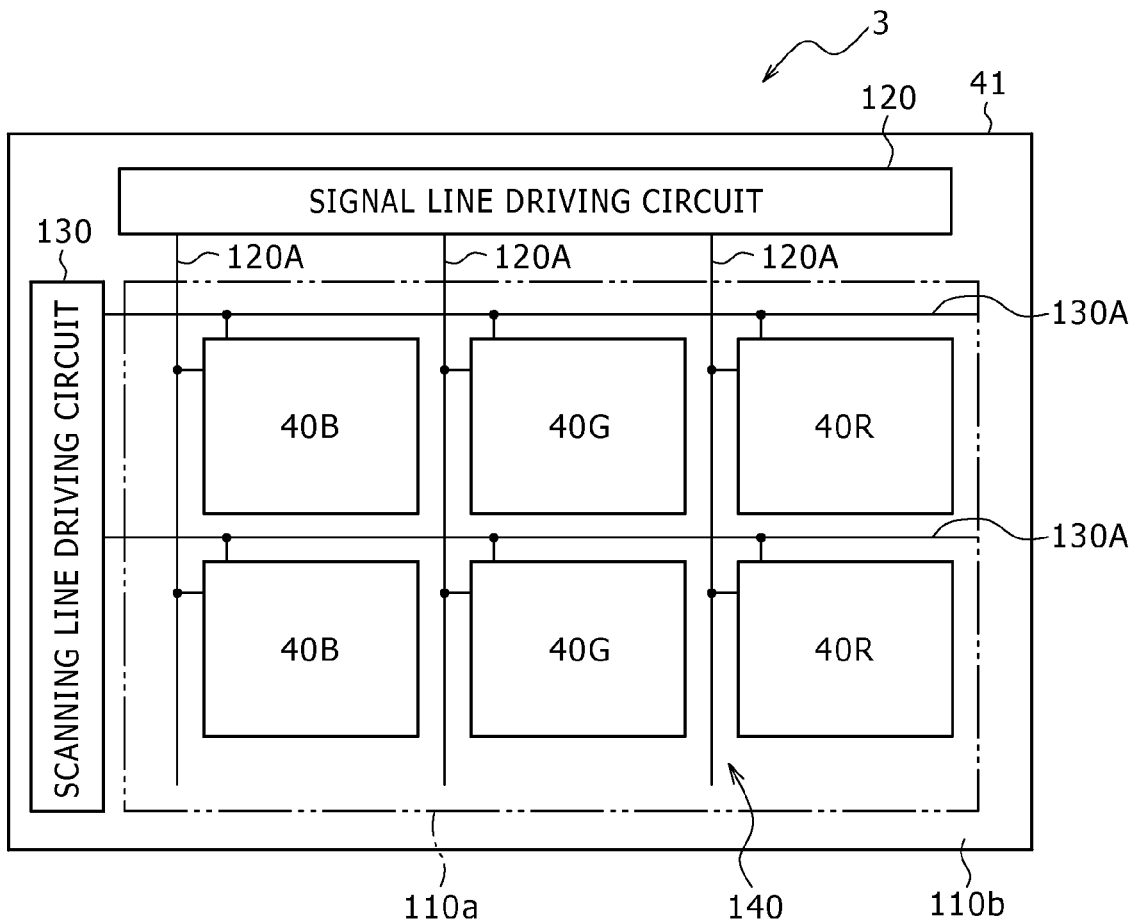
FIG. 14 is a block diagram showing a configuration of a display device according to a second embodiment of the present disclosure.

FIG. 14 is a block diagram showing a configuration of a display device (a display device 3) according to the third embodiment of the present disclosure. The display device 3 is an organic Electroluminescence (EL) display device. For example, plural red color pixels 40R, green color pixels 40G, and blue color pixels 40B are disposed in a matrix in a display area 110a (first area) at the central portion on a substrate 41 so as to have a predetermined pattern (first pattern). A driver signal line driving circuit 120 and a scanning line driving circuit 130 for image display are provided in a non-display area 110b (second area) as an area adjacent to the display area 110a and other than the display area 110a.

Configuration of Display Device 3

Entire Configuration

Figure 15:
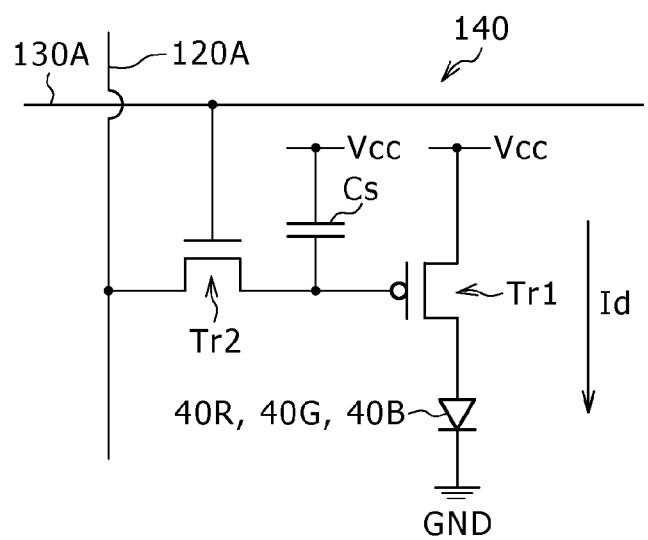
FIG. 15 is a circuit diagram showing a part of a pixel driving circuit shown in FIG. 14.

A pixel driving circuit 140 is provided within the display area 110a. The pixel driving circuit 140, as shown in FIG. 15, includes a drive transistor Tr1 and a write transistor Tr2. Also, a hold capacitor Cs is provided in an area between the drive transistor Tr1 and the write transistor Tr2. The red color pixel 40R (or the green color pixel 40G, the blue color pixel 40B) is connected in series with the drive transistor Tr1 between a first power source line (Vcc) and a second power source line (GND). The signal line driving circuit 120 supplies an image signal to a source electrode of the write transistor Tr2 through corresponding one of plural signal lines 120A disposed in a column direction. The scanning line driving circuit 130 successively supplies a scanning signal to a gate electrode of the write transistor Tr2 through corresponding one of plural scanning lines 130A disposed in a row direction. Each of the drive transistor Tr1 and the write transistor Tr2 is composed of a general Thin Film Transistor (TFT) and a structure thereof, for example, either may be a reverse staggered structure (a so-called bottom-gate type) or may be a staggered structure (top-gate type) and thus is especially by no means limited.

Pixel

Figure 16:
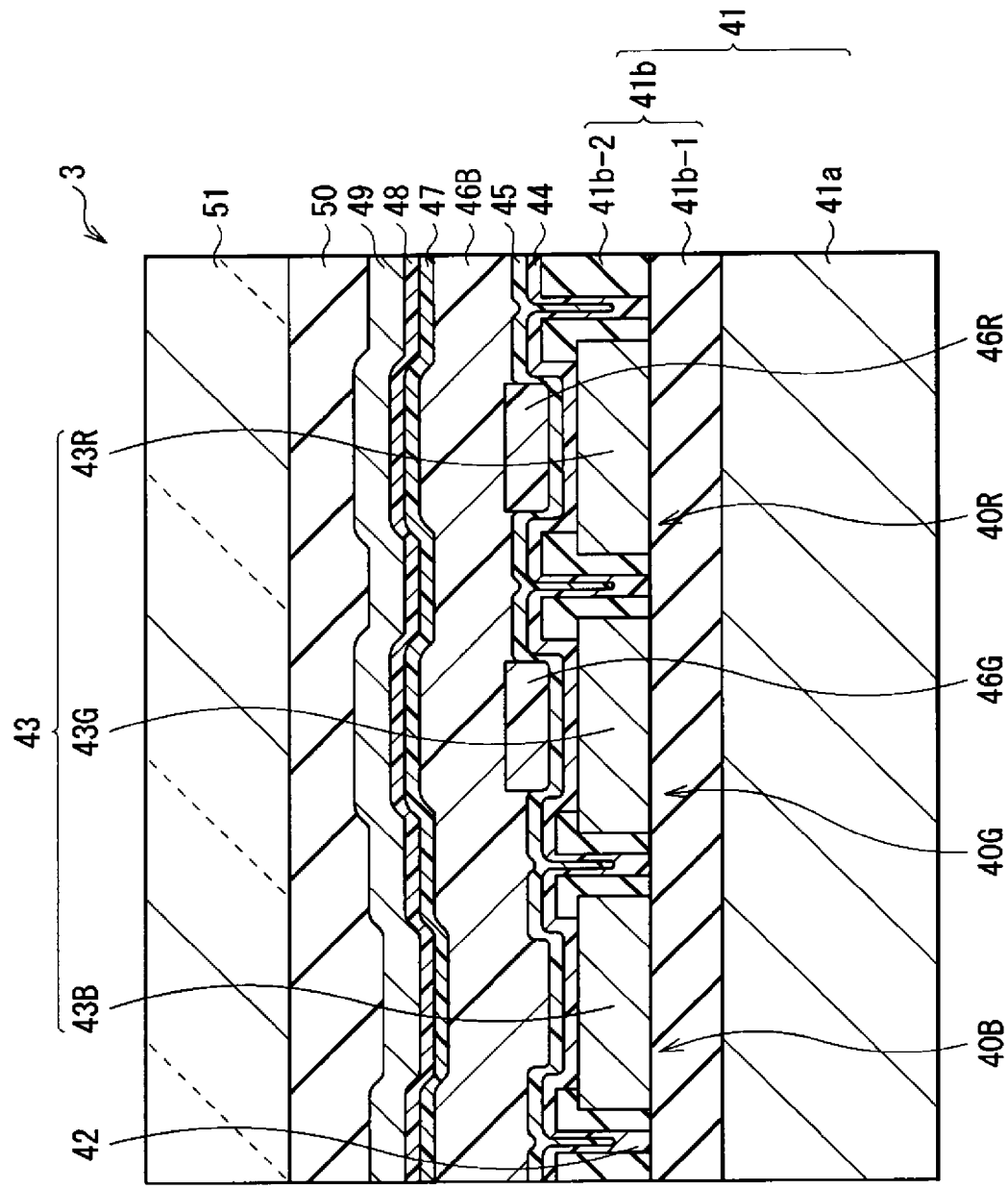
FIG. 16 is a cross sectional view showing a part of a structure of the display device shown in FIG. 14.

FIG. 16 shows a cross-sectional structure of the display area 110a shown in FIG. 14. Each of the red color pixel 40R, the green color pixel 40G, and the blue color pixel 40B has a structure in which a lower electrode 43 as an anode, a hole injection layer 44, a hole transport layer 45, a blue light emitting layer 46B, an electron transport layer 47, an electron injection layer 48, and an upper electrode 49 as a cathode are laminated in this order from a side of a substrate 41. The red color pixel 40R and the green color pixel 40G are provided with a red light emitting layer 46R (composed of an organic film), and a green light emitting layer 46G (composed of an organic film), respectively, between the hole transport layer 45 and the blue light emitting layer 46B.

Such a red color pixel 40R, a green color pixel 40G, and a blue color pixel 40B are all covered with a protective layer 50. Also, an encapsulating substrate 51 made of a glass or the like is stuck to the entire surface of the protective layer 50 through an adhesion layer (not shown) made of either a thermosetting resin or an ultraviolet cure resin.

The substrate 41 is composed of a base 41a and an insulating film 41b, and the drive transistor Tr1 (not shown) of the pixel driving circuit 140 is provided between the base 41a and the insulating film 41b. The base 41a is a supporting body on which the red color pixel 40R, the green color pixel 40G, and the blue color pixel 40B are disposed and formed. Thus, it is only necessary to compose the base 41a of a known member such as a quartz, a glass, a metallic foil, or a film or sheet made of a resin. In particular, the base 41a is preferably made of the quartz or the glass. When the member made of the resin is used, a methacrylic resin class typified by polymethylmethacrylate (PMMA), a polyester class such as polyethylene telephthalate (PET), polyethylene naphthalate (PEN), or polybutylene naphthalate (PBN), a polycarbonate resin or the like can be used as the material for the base 41a. In this case, however, for the purpose of suppressing both of the water permeability and the gas permeability, preferably, the lamination structure is adopted, and the surface treatment is carried out.

In the insulating film 41b, an insulating film 41b-1 and an insulating film 41b-2 are laminated in this order from the base 41a side. The insulating film 41b-1 is formed in order to planarize the surface of the base 41a having the pixel driving circuit 140 formed thereon. The insulating film 41b-1 is preferably made of a material providing an excellent pattern precision because a fine connection hole (not shown) through which the drive transistor Tr1 and the lower electrode 43 are connected to each other is formed. The material composing the insulating film 41b-1, for example, includes an organic material such as polyimide, or an inorganic material such as a silicon oxide ($SiO_2$). A photosensitive resin such as positive photosensitive polybenzoxazole or positive photosensitive polyimide may be laminated on the inorganic insulating material such as the silicon oxide.

The insulating film 41b-2 is provided between the lower electrode 43 and the upper electrode 49 and ensures the insulating property between the lower electrode 43 and the upper electrode 49. In addition, opening portions are provided in the insulating film 41b-2 so as to correspond to the red color pixel 40R, the green color pixel 40G, and the blue color pixel 40B, respectively. The light emission region can be formed into a desired shape through the opening portions of the insulating film 41b-2. Although the upper layers of the insulating film 41b-2, that is, from the hole injection layer 44 to the upper electrode 49 may be provided not only in the opening portion, but also on the insulating film 41b-2, the light emission is generated only in the opening portion.

Figure 17A:
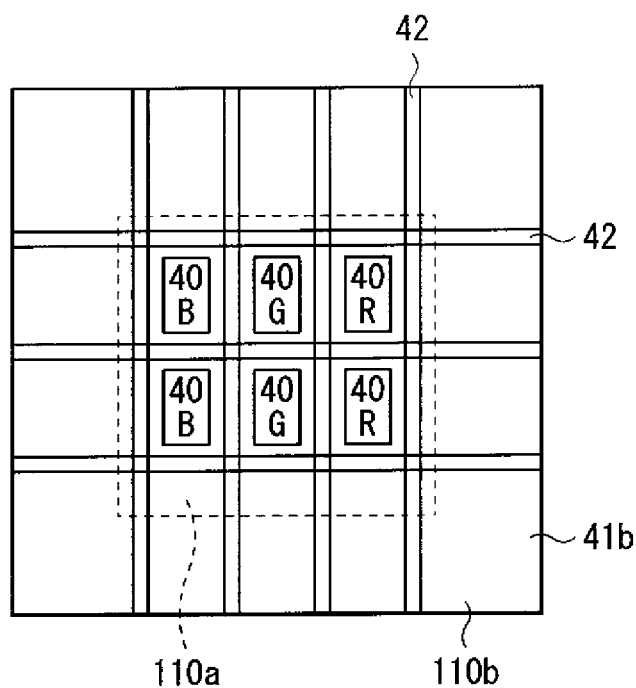
FIGS. 17A and 17B are respectively a top plan view showing a substrate shown in FIG. 16, and a cross sectional view showing a structure of a part of the substrate shown in FIG. 17A.

The insulating film 41b (the insulating film 41b-2) in the second embodiment includes trench-like bubble discharging paths 42 between the opening portion in which the red color pixel 40R is formed and the opening portion in which the green color pixel 40G is formed, and between the opening portion in which the green color pixel 40G is formed and the opening portion in which the blue color pixel 40B is formed. As shown in FIG. 17A, each of the bubble discharging paths 42 extends up to the non-display area 110b to communicate with corresponding one of the end portions of the substrate 41. The bubble discharging paths 42 are formed in both of the scanning line direction (row direction) and the signal line direction (column direction). Although details will be described later, the provision of the bubble discharging paths 42 results in that the bubble 102 is prevented from entering the space defined between the blanket 31 and the substrate 41 when the blue light emitting layer 46B and the red light emitting layer 46R are formed by utilizing the offset reverse printing method. As a result, the red light emitting layer 46R and the green light emitting layer 46G can be formed on the substrate 41 so as to have the precise pattern. Note that, the bubble discharging paths 42 may also be provided only either in the scanning line direction or in the signal line direction. Also, even when none of the bubble discharging paths 42 communicates with the atmosphere, all it takes is that the bubble discharging paths 42 each extend up to the non-display area 110b.

Figure 17B:
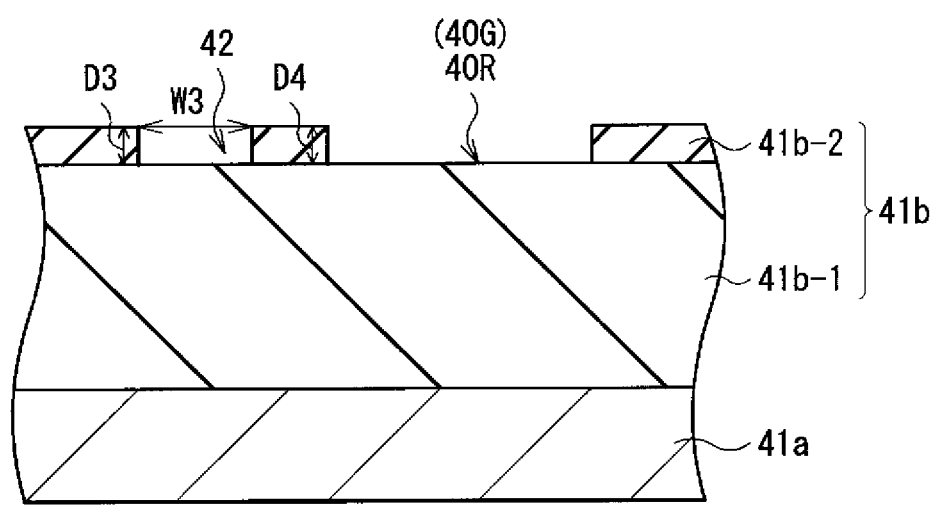

As shown in FIG. 17B, a depth D3 of the bubble discharging path 42 and a depth D4 of each of the opening portions in which the red color pixel 40R, the green color pixel 40G and the blue color pixel 40B are formed, respectively, are preferably approximately equal to each other. The reason for this is because the bubble discharging paths 42 can be formed concurrently with the formation of the opening portion, thereby simplifying the manufacturing process. Each of the depths D3 and D4, for example, is 1 μm and a width W3 of each of the bubble discharging paths 42, for example, is 5 μm.

The lower electrodes 43R, 43G, and 43B are provided so as to correspond to the red color pixel 40R, the green color pixel 40G, and the blue color pixel 40B, respectively, on the insulating film 41b. Also, each of the lower electrodes 43R, 43G, and 43B, for example, is made of a simple substance of chromium (Cr), gold (Au), platinum (Pt), nickel (Ni), copper (Cu), tungsten (W), silver (Ag) or the like or an alloy thereof. Or, each of the lower electrodes 43R, 43G, and 43B may also adopt a lamination structure of the metallic film or films described above and a transparent conductive film. The transparent conductive film, for example, includes an indium tin oxide (ITO), an indium zinc oxide (InZnO), an alloy of a zinc oxide (ZnO) and aluminum (Al), and the like. When the lower electrode 43 is used as the anode, preferably, the lower electrode 43 is made of a material providing a high hole injection property. However, even in the case of a material such as an aluminum alloy having an insufficient work function, such a material can be made to function as the anode by providing the suitable hole injection layer 44.

The hole injection layer 44 is provided so as to be common to the red color pixel 40R, the green color pixel 40G, and the blue color pixel 40B, and has a function as a buffer layer for enhancing the hole injection efficiency, and preventing generation of a leakage current. The hole injection layer 44, for example, is preferably formed so as to have a thickness of 5 to 100 nm, and is more preferably formed so as to have a thickness of 8 to 50 nm.

A material composing the hole injection layer 44, for example, includes polyaniline and a derivative thereof, polythiophene and a derivative thereof, polypyrrole and a derivative thereof, polyphenylenhe and a derivative thereof, polythienylenevinylene and a derivative thereof, polyquinoline and a derivative thereof, polyquinoxaline and a derivative thereof, a conductive high-molecular material such as a high-molecular material containing an aromatic amine structure in a main chain or side chain thereof, metal phthalocyanine (such as copper phthalocyanine), carbon or the like. However, the material composing the hole injection layer 44 may be suitably selected in relation to the materials of the electrode, and the adjacent layer.

The hole transport layer 45 is provided in order to enhance the efficiency of the transport of the holes to the red light emitting layer 46R, the green light emitting layer 46G, and the blue light emitting layer 46B. Thus, the hole transport layer 45 is provided so as to be common to the red light emitting layer 46R, the green light emitting layer 46G, and the blue light emitting layer 46B on the hole injection layer 44.

Although depending on the entire structure of the element, a thickness of the hole transport layer 45, for example, is preferably set in the range of 10 to 200 nm, and is more preferably set in the range of 15 to 150 nm. A luminescent material which is solubilized into an organic solvent, for example, polyvinylcarbazole and a derivative thereof, polyfluorene and a derivative thereof, polyaniline and a derivative thereof, polysilane and a derivative thereof, a polysiloxane derivative having aromatic amine in a side chain or main chain thereof, polythiophene and a derivative thereof, polypyrrole or the like can be used as the high-molecular material composing the hole transport layer 45.

In each of the red light emitting layer 46R and the green light emitting layer 46G, the application of the electric field results in that the electron and the hole are recombined with each other to emit a light. The red light emitting layer 46R and the green light emitting layer 46G are provided in the red color pixel 40R and the green color pixel 40G, respectively. Although depending on the entire structure of the element, a thickness of each of the red light emitting layer 46R and the green light emitting layer 46G, for example, is preferably set in the range of 10 to 200 nm, and is more preferably set in the range of 15 to 150 nm. A material which is obtained by, for example, doping a polyfluorene system polymer derivative, a (poly) paraphenylenevinylene derivative, a polyphenylene derivative, a polyvinylcarbazole derivative, a polythiophene derivative, a perylene system pigment, a coumaline system pigment, a Rhodamine system pigment or the high-molecular material described above with an organic EL material can be used as the high-molecular material composing each of the red light emitting layer 46R and the green light emitting layer 46G. Specifically, the material which is obtained by, for example, doping the polyfluorene system polymer derivative, the (poly)paraphenylenevinylene derivative, the polyphenylene derivative, the polyvinylcarbazole derivative, the polythiophene derivative, the perylene system pigment, the coumaline system pigment, the Rhodamine system pigment or the high-molecular material described above with rubrene, perylene, 9,10-diphenylanthracene, tetraphenylbutadiene, nile red, coumaline 6 or the like can be used as the high-molecular material composing each of the red light emitting layer 46 and the green light emitting layer 46G.

In the blue light emitting layer 46B, the application of the electric field results in that the electron and the hole are recombined with each other to emit a light. Also, the blue light emitting layer 46B is provided as a common layer on the upper layer of the hole transport layer 45 in the red light emitting layer 46R, the green light emitting layer 46G, and the blue color light pixel 40B. That is to say, the blue light emitting layer 46B is provided so as to be common to the red color pixel 40R, the green color pixel 40G, and the blue color pixel 40B. The blue light emitting layer 46B, for example, is obtained by doping an anthracene compound as a host material with an organic light emitting material such as a blue color or green color low-molecular fluorescence pigment, a phosphorescence pigment or a metal complex as a guest material. Thus, the blue light emitting layer 46B emits either a blue color or green color light.

The electron transport layer 47 is provided in order to enhance the efficiency of the transport of the electrons to the red light emitting layer 46R, the green light emitting layer 46G, and the blue light emitting layer 46B. Thus, the electron transport layer 47 is provided as a common layer over the entire surface of the blue light emitting layer 46B. For example, quinolone, perylene, phenanthroline, phenanthrene, pyrene, bisstyryl, pyrazine, triazole, oxazole, fullerene, oxadiazole, fluorenone, anthracene, naphthalene, butadiene, coumalin, acridine, stilben or a derivative thereof or a metal complex thereof, for example, tris(8-hydroxyquinoline)aluminum (abbreviated as $Alq_3$) can be used as the material for the electron transport layer 47.

The electron injection layer 48 is provided in order to enhance the efficiency of the injection of the electrons, and is also provided as a common layer over the entire surface of the electron transport layer 47. For example, a lithium oxide ($Li_2O$) as an oxide of lithium (Li), a cesium carbonate ($Cs_2CO_3$) as a composite oxide of cesium, or a mixture thereof can be used as the material for the electron injection layer 48. In addition, an alkaline earth metal such as calcium (Ca) or barium (Ba), an alkaline metal such as lithium or cesium, or a metal, such as indium (In) or magnesium (Mg), having a small work function may also be used in the form of a simple substance or an alloy as the material for the electron injection layer 48. Or, an oxide, a composite oxide, or a fluoride of any of such metals may also be used in the form of a simple substance or a mixture as the material for the electron injection layer 48.

The upper electrode 49 is provided over the entire surface of the electron injection layer 48 so as to be insulated from the lower electrode 43. That is to say, the upper electrode 49 is provided as an electrode common to the red color pixel 40R, the green color pixel 40G, and the blue color pixel 40B. The upper electrode 49, for example, is composed of a metallic conductive film having a thickness of 3 to 8 nm. Specifically, the upper electrode 49, for example, is made of an alloy containing therein aluminum (Al), magnesium (Mg), calcium (Ca) or sodium (Na). In particular, an alloy (Mg—Ag alloy) of magnesium and silver is preferable because both of light permeability and conductivity are excellent. Although a ratio of magnesium and silver is especially by no means limited, a thickness ratio of magnesium and silver is preferably set in the range of Mg:Ag=20:1 to 1:1. In addition, an alloy (Al—Li alloy) of aluminum and lithium may also be used as the material for the upper electrode 49.

The upper electrode 49 may be composed of a mixture layer containing therein an organic luminescent material such as an alumiquinoline complex, styrylamine derivative or a phthalocyanine derivative. In this case, the upper electrode 49 may specially further include a layer, such as a layer made of an Mg—Ag alloy, having the light permeability as a third layer.

Protective Layer and Encapsulating Substrate

The protective layer 50 may be made of either an insulating material or a conductive material. The protective layer 50, for example, is formed so as to have a thickness of 2 to 3 μm. For example, an inorganic amorphous insulating material such as amorphous silicon (α—Si), an amorphous silicon carbide (α—SiC), an amorphous silicon nitride (α—$Si_{i-x}N_x$) or amorphous carbon (α-C) can be used as the material for the protective layer 50. Such a material is low in water permeability because it does not compose a grain, and thus becomes an excellent protective film.

The encapsulating substrate 51 is located on the side of the upper electrode 49 of the red color pixel 40R, the green color pixel 40G, and the blue color pixel 40B. Thus, the red color pixel 40R, the green color pixel 40G, and the blue color pixel 40B are encapsulated with the encapsulating substrate 51 together with an adhesion layer (not shown). The encapsulating substrate 51 is made of a glass or the like.

The encapsulating substrate 51, for example, is provided with a color filter (not shown), and a light blocking film (not shown) serving as a black matrix. As a result, the lights emitted from the red color pixel 40R, the green color pixel 40G, and the blue color pixel 40B, respectively, are taken out. Also, an outside light which is reflected by the red color pixel 40R, the green color pixel 40G, and the blue color pixel 40B, and wirings among them is absorbed, and thus an excellent contrast is obtained.

Method of Manufacturing Display Device 3

Such a display device 3, for example, is manufactured as follows

Firstly, the pixel driving circuit 140 including the drive transistor Tr1 is formed on the base 41*b* made of the material described above, and the insulating film 41*b*-1, for example, made of photosensitive polyimide is provided. Next, the transparent conductive film, for example, made of an ITO is deposited over the entire surface of the substrate 41, and is then patterned to form the lower electrodes 43R, 43G, and 43B. In addition, the lower electrodes 43R, 43G, and 43B are made to communicate with the drain electrodes of the drive transistors Tr1 through the contact holes (not shown) of the insulating film 41*b*-1, respectively. Next, the insulating film 41*b*-2 is deposited on the lower electrodes 43R, 43G, and 43B, and on the insulating film 41*b*-1. After that, the opening portions corresponding to the red color pixel 40R (the lower electrode 43R), the green color pixel 40G (the lower electrode 43G), and the blue color electrode 40B (the lower electrode 43B), respectively, are formed in the insulating film 41*b*-2, and at the same time, the bubble discharging paths 42 are formed.

After completion of the formation of the insulating film 41*b*, the surface of the substrate 41 is subjected to an oxygen plasma treatment to remove a contamination such as an organic substance adhered to the surface of the substrate 41, thereby enhancing the wettability. Specifically, the substrate 41 is heated at a predetermined temperature, for example, at a temperature of about 70 to about 80° C., and is subsequently subjected to the plasma treatment ($O_2$ plasma treatment) using an oxygen gas as a reactive gas at the atmospheric pressure.

After completion of the plasma treatment, the hole injection layer 44 and the hole transport layer 45 which are made of the materials described above, respectively, are formed so as to be common to the red color pixel 40R, the green color pixel 40G, and the blue color pixel 40B. The hole injection layer 44 and the hole transport layer 45 which are made of the materials described above, respectively, are deposited onto the lower electrodes 43R, 43G, and 43B, and onto the insulating film 41*b* by, for example, utilizing either the slit coating method or the spin coating method.

After completion of the formation of the hole transport layer 45, the red light emitting layer 46R and the green light emitting layer 46G are formed on the parts of the hole transport layer 45 corresponding to the red color pixel 40R and the green color pixel 40G, respectively. Since in the display device 3 of the second embodiment, the bubble discharging paths 42 are provided in the substrate 41, the display device 3 of the second embodiment especially has the feature in this process. Hereinafter, this process for providing the bubble discharging paths 42 in the substrate 41 will be described in detail.

As shown in FIGS. 18A and 18B, the red light emitting layer 46R and the green light emitting layer 46G are formed by utilizing a printing method using a flat plate-like blanket, for example, an offset reverse printing system. FIG. 18A shows a cross-sectional structure of the display area 110*a* in the phase of the formation of the red light emitting layer 46R and the green light emitting layer 46G, and FIG. 18B shows a planar structure of the display area 110*a* in the phase of the formation of the red light emitting layer 46R and the green light emitting layer 46G. It is noted that in FIG. 18A, an illustration of the hole injection layer 44 and the hole transport layer 45 is omitted for the sake of convenience. As shown in FIG. 18A, firstly, a transfer layer 32D made of the material composing the red light emitting layer 46R described above is formed on the blanket 31. Like the processes, for example, shown in FIGS. 6A to 6D, the transfer layer 32D is previously formed on the blanket 31 by using the block (for example, the reverse printing block 1) so as to have a pattern corresponding to the red color pixel 40R. Next, the blanket 31 and the substrate 41 on which up to the hole transport layer 45 is formed are successively caused to come in contact with each other from the display area 110*a* at the central portion to the non-display area 110*b* by utilizing the pressed compression method. As a result, as shown in FIG. 16, the red light emitting layer 46R is printed on the area of the red color pixel 40R. This also applies to the green light emitting layer 46G.

Figure 19A:
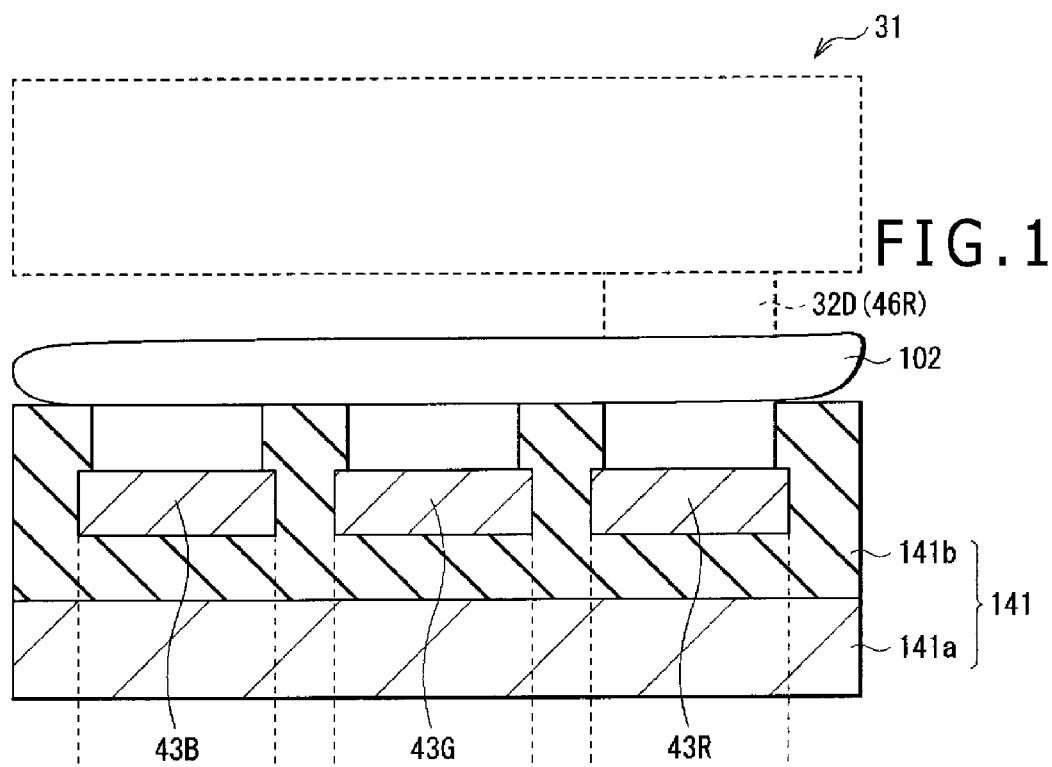
FIGS. 19A and 19B are respectively views explaining processes for printing a red light emitting layer when there is no bubble discharging path.
Figure 19B:
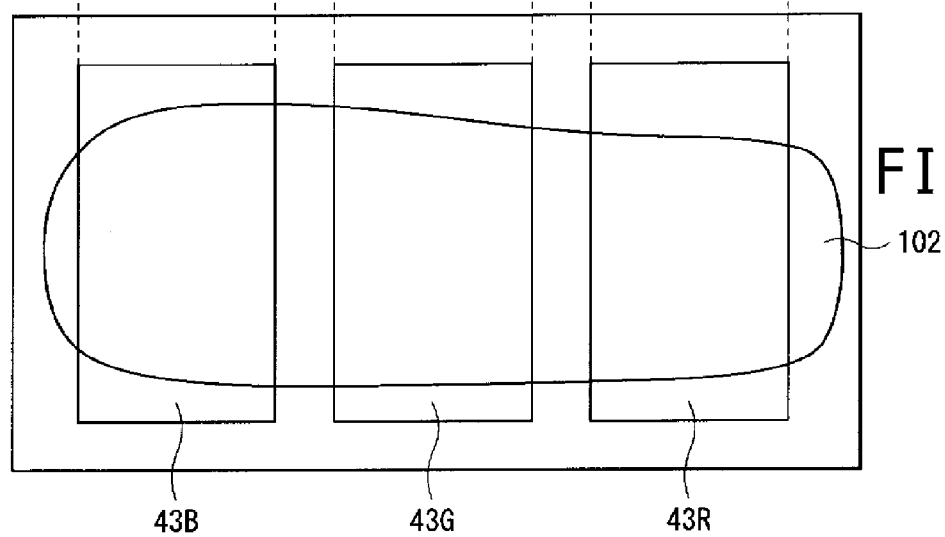

Since as shown in FIGS. 19A and 19B, no bubble discharging path 42 is provided in the existing substrate 141, when the bubble 102 enters the space defined between the blanket 31 and the substrate 141 in the phase of the printing of the red light emitting layer 46R (or the green light emitting layer 46G), there is the possibility that the bubble 102 is left in the display area 110*a*. Since due to the presence of the bubble 102, an area on which the red light emitting layer 46R (or the green light emitting layer 46G) is not printed is generated on the substrate 141, in the existing substrate 141, it is difficult to from the red light emitting layer 46R (or the green light emitting layer 46G) having the precise pattern.

On the other hand, since the substrate 41 in the second embodiment has the bubble discharging paths 42, even when as shown in FIG. 18A, the bubble 102 enters the space defined between the blanket 31 and the substrate 41, the bubble 102 is introduced into the bubble discharging paths 42 to be discharged from the end portion of the substrate 41 through the non-display area 110*b*. In a word, since the bubble 102 is prevented from being confined in the space defined between the blanket 31 and the substrate 41 when the blanket 31 and the substrate 41 are brought into contact with each other, the tight adhesion between the blanket 31 and the substrate 41 is prevented from being impeded. Therefore, the red light emitting layer 46R (or the green light emitting layer 46G) having the precise pattern can be formed on the substrate 41 without requiring any of the complicated mechanisms, in a word, at the low cost and in the excellent yield. It is noted that even when the bubble discharging paths 42 do not communicate with the atmosphere, all it takes is that the bubble discharging paths 42 extend up to at least the non-display area 110*b*. The reason for this is because the blanket 31 and the substrate 41 can be tightly adhered to each other in the display area 110*a* because the bubble 102 can be moved to the non-display area 110*b* by applying the pressing force against the display area 110*a*.

After completion of the formation of the red light emitting layer 46R and the green light emitting layer 46G, the blue light emitting layer 46B made of the material described above is formed as the common layer over the entire surfaces of the red light emitting layer 46R and the green light emitting layer 46G, and the hole transport layer 45 in the blue color pixel 40B by, for example, utilizing an evaporation method.

After completion of the formation of the blue light emitting layer 46B, the electron transport layer 47, the electron injection layer 48, and the upper electrode 49 which are made of the materials described above, respectively, are formed in this order over the entire surface of the blue light emitting layer 46B by, for example, utilizing an evaporation method.

After completion of the formation of the upper electrode 49, the protective layer 50 is formed over the entire surface of the upper electrode 49 by, for example, utilizing either an evaporation method or a CVD (Chemical Vapor Deposition) method. In this case, for the purpose of preventing the reduction of the luminance following the deterioration of the red light emitting layer 46R, the green light emitting layer 46G, the blue light emitting layer 46B, and the like, the deposition temperature is preferably set at the room temperature. In addition thereto, for the purpose of preventing the peeling of the protective layer 50, preferably, the deposition is carried out under such a condition that a stress applied to the film becomes minimal.

Each of the blue light emitting layer 46B, the electron transport layer 47, the electron injection layer 48, the upper electrode 49, and the protective layer 50 is a so-called solid film which is formed over the entire surface without using a mask. In addition, preferably, the blue light emitting layer 46B, the electron transport layer 47, the electron injection layer 48, the upper electrode 49, and the protective layer 50 are continuously formed within the same deposition system without being exposed to the atmosphere. The reason for this is because the deterioration due to the moisture in the atmosphere is prevented.

After completion of the formation of the protective layer 50, the encapsulating substrate 51 is stuck to the protective layer 50 through the adhesion layer (not shown). It is noted that the light blocking film and the color filter which are made of the materials described above, respectively, are both previously formed on the encapsulating substrate 51. With that, the organic EL display device shown in FIGS. 14 to 16 is completed.

Operation and Effects of Display Device 3

In the display device 3, the scanning signals are supplied from the scanning line driving circuit 130 to the pixels through the gate electrodes of the write transistors Tr2, respectively. Also, the image signals are supplied from the signal line driving circuit 120 to be held in the hold capacitors Cs through the write transistors Tr2, respectively. That is to say, the drive transistor Tr1 is controlled so as to be turned ON or OFF in accordance with the image signal held in the hold capacitor Cs. As a result, a drive current Id is injected into each of the red color pixel 40R, the green color pixel 40G, and the blue color pixel 40B, so that the hole and the electron are recombined with each other to emit a light. In the case of the bottom emission, the light is transmitted through the lower electrode 43R, 43G, 43B, and the substrate 41 to be taken out to the outside. On the other hand, in the case of the top emission, the light is transmitted through the upper electrode 49, the color filter (not shown), and the encapsulating substrate 51 to be taken out to the outside.

In this case, although both of the red light emitting layer 46R and the blue light emitting layer 46B are provided in the red color pixel 40R, the energy is moved to the red color having the lowest energy level, and thus the red color light emission (having the wavelength of 620 to 750 nm) becomes dominant. Although both of the green light emitting layer 46G and the blue light emitting layer 46B are provided in the green color pixel 40G, the energy is moved to the green color having the lower energy level, and thus the green color light emission (having the wavelength of 495 to 570 nm) becomes dominant. Also, since the blue color pixel 40B has only the blue light emitting layer 46B, the blue light emission (having the wavelength of 450 to 495 nm) is caused. In this case, since the bubble discharging paths 42 are formed in the substrate 41, the bubble 102 confined in the space defined between the blanket 31 and the substrate 41 in the process for forming the red light emitting layer 46R and the green light emitting layer 46G is moved to the non-display area 110b through the bubble discharging paths 42. As a result, the red light emitting layer 46R and the green light emitting layer 46G each having the precise pattern are formed on the substrate 41.

As has been described, in the second embodiment, since the bubble discharging paths 42 are provided in the substrate 41, the red light emitting layer 46R and the green light emitting layer 46G each having the precise pattern can be formed on the substrate 41 without requiring any of the complicated mechanisms. Therefore, the display device 3 can be manufactured at the low cost and in the excellent yield.

7. Modification 6

FIG. 20 is a top plan view showing a planar structure of a substrate 41A in a display device according to Modification of the second embodiment. Plural display areas 110a are provided in the substrate 41A. That is to say, the substrate 41A is a substrate having the so-called multi-surface patterns. Except for this point, the substrate 41A has the same structure as that of the substrate 41 in the display device 3 of the second embodiment, and thus an operation and effects thereof are also the same as those in the display device 3 of the second embodiment.

In the substrate 41A, for example, each adjacent two display areas 110a of the four display areas 110a are disposed along two sides facing each other of the flat plate-like substrate 41A. Also, the bubble discharging paths 42 are provided in such a way that each adjacent two display areas 110a communicate with each other. That is to say, even in the case of the substrate having the multi-surface patterns, the common bubble discharging path 42 can also be provided in such a way that the adjacent two display areas 110a communicate with each other.

8. Module and Examples of Application

Hereinafter, a description will be given with respect to examples of application of the display device according to the second embodiment of the present disclosure described above. The display device 3 of the second embodiment described above can be applied to the display devices, of electronic apparatuses in all the fields, in each of which a video signal inputted from the outside to the electronic apparatus, or a video signal generated in the electronic apparatus is displayed in the form of an image or a video image. In this case, the electronic apparatuses include a television set, a digital camera, a notebook-size personal computer, mobile terminal equipment such as a mobile phone, and a video camera.

Module

Figure 21:
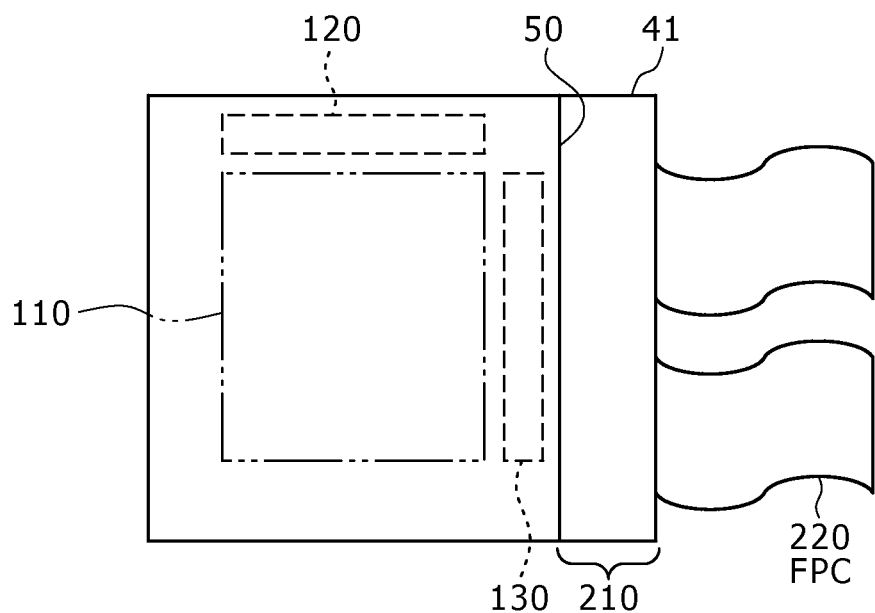
FIG. 21 is a top plan view showing a module-shaped display device in the form of which the display device shown in FIG. 14 of the second embodiment is incorporated in various electronic apparatuses.

The display device 3 of the second embodiment described above is incorporated as a module, for example, as shown in FIG. 21, in various kinds of electronics apparatuses exemplified as first to fifth examples of application which will be described later. In the module, for example, an area 210 exposed from both of the protective layer 50 and the encapsulating substrate 51 in the second embodiment is provided in one side of the substrate 41, and wirings of the signal line driving circuit 120 and the scanning driving circuit 130 are made to extend to form external connection terminals (not shown) in the exposed area 210. A flexible printed circuit (FPC) board 220 for input/output of the signals may be provided in those external connection terminals.

First Examples of Application

Figure 22:
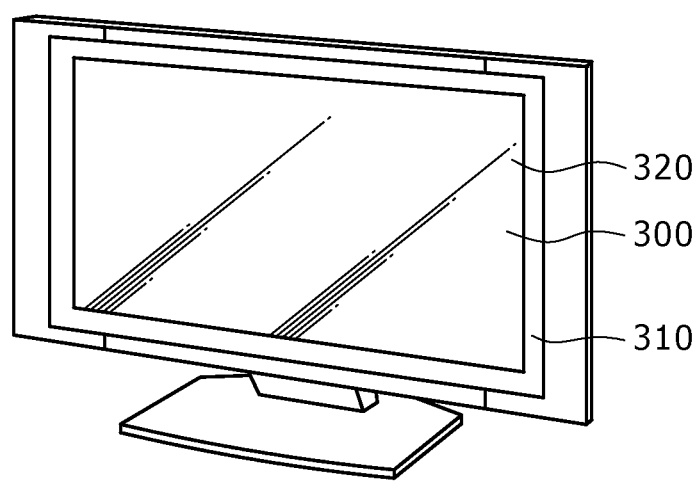
FIG. 22 is a perspective view showing an external appearance of a television set as a first example of application to which the display device shown in FIG. 14 of the second embodiment is applied.

FIG. 22 is a perspective view showing an external appearance of a television set as a first example of application to which the display device of the second embodiment is applied. The television set, for example, includes an image display screen portion 300 composed of a front panel 310 and a filter glass 320. In this case, the image display screen portion 300 is composed of the display device 3 of the second embodiment described above.

Second Example of Application

Figure 23A:
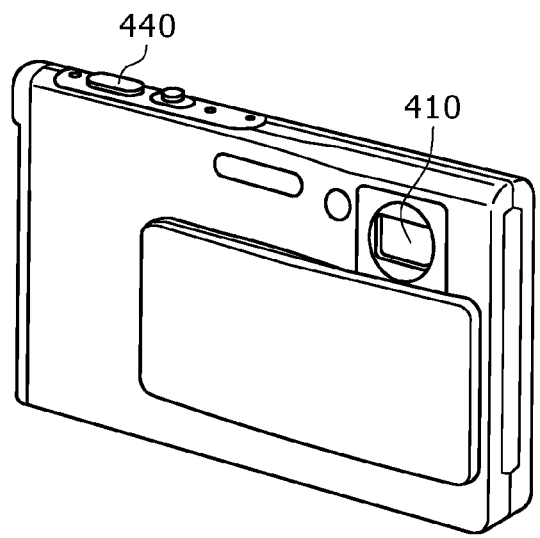
FIGS. 23A and 23B are respectively a perspective view showing an external appearance of a digital camera as a second example of application, when viewed from a front side, to which the display device shown in FIG. 14 of the second embodiment is applied, and a perspective view of the digital camera as the second example of application, when viewed from a back side, to which the display device shown in FIG. 14 of the second embodiment is applied.
Figure 23B:
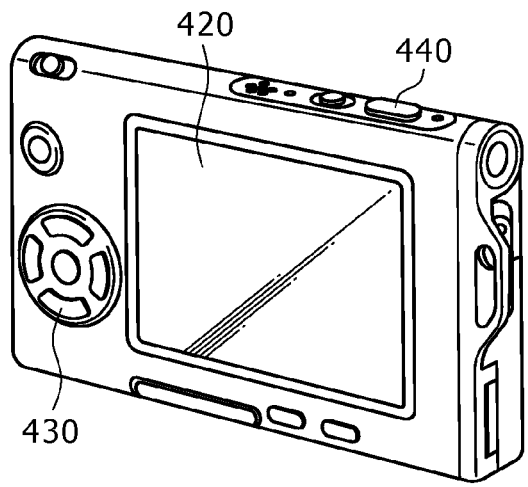

FIGS. 23A and 23B are respectively perspective views showing respective external appearances of a digital camera as a second example of application to which the display device of the second embodiment descried above is applied. The digital camera, for example, includes a light emitting portion 410 for flash, a display portion 420, a menu switch 430, and a shutter button 440. In this case, the display portion 420 is composed of the organic EL display device 3 of the second embodiment described above.

Third Example of Application

Figure 24:
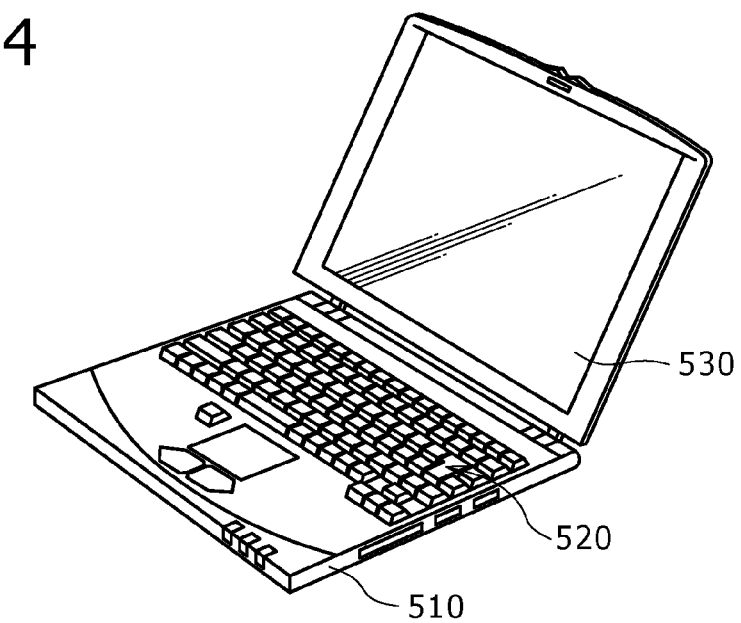
FIG. 24 is a perspective view showing an external appearance of a notebook-size personal computer as a third example of application to which the display device shown in FIG. 14 of the second embodiment is applied.
Figure 25:
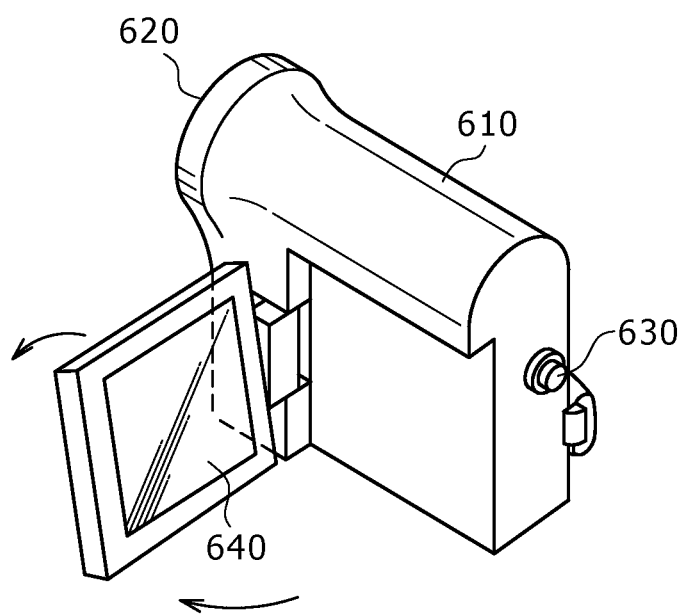
FIG. 25 is a perspective view showing an external appearance of a video camera as a fourth example of application to which the display device shown in FIG. 14 of the second embodiment is applied.

FIG. 24 is a perspective view showing an external appearance of a notebook-size personal computer as a third example of application to which the organic EL display device of the second embodiment described above is applied. The notebook-size personal computer, for example, includes a main body 510, a keyboard 520 which is manipulated when characters or the like are inputted, and a display portion 530 for displaying thereon an image. In this case, the display portion 530 is composed of the display device 3 of the second embodiment described above. ps Fourth Example of Application FIG. 25 is a perspective view showing an external appearance of a video camera as a fourth example of application to which the display device of the second embodiment described above is applied. The video camera, for example, includes a main body portion 610, a lens 620 which captures an image of a subject and which is provided on a side surface directed forward, a start/stop switch 630 which is manufactured when an image of a subject is captured, and a display portion 640. In this case, the display portion 640 is composed of the display device 3 of the second embodiment described above.

Fifth Example of Application

FIGS. 26A to 26G are respectively views showing respective external appearances of a mobile phone as a fifth example of application to which the display device of the second embodiment described above is applied. The mobile phone, for example, is constructed in such a way that an upper chassis 710 and a lower chassis 720 are coupled to each other through a coupling portion (hinge portion) 730. The mobile phone, for example, includes a display portion 740, a sub-display portion 750, a picture light 760, and a camera 770 in addition to the upper chassis 710, the lower chassis 720, and the coupling portion (hinge portion) 730. In this case, of these constituent elements, either the display portion 740 or the sub-display portion 750 is composed of the display device 3 of the second embodiment described above.

Although the present disclosure has been described so far based on the embodiments and Modifications, the present disclosure is by no means limited thereto, and thus various kinds of changes can be made. For example, the shape of the bubble discharging path 12, 15, and 42 is by no means limited to the shapes described in the embodiments and Modifications, and thus the bubble discharging path may also have any other suitable pattern shape.

In addition, although in the second embodiment described above, the display device is exemplified in which the red color pixels 40R, the green color pixels 40G, and the blue color pixels 40B are disposed in a matrix, the red color pixels 40R, the green color pixels 40G, and the blue color pixels 40B may also be disposed in any other suitable pattern.

Moreover, in FIGS. 5, 14, and 16, the organic EL display device is exemplified in which the red color pixel (R), the green color pixel (G), and the blue color pixel (B) are disposed. However, the present disclosure can also be applied to the case where light emitting layers of a display device having a pixel disposition such as RGBY having a yellow color pixel (Y), RGBW having a white color pixel (W) or YB are printed. In addition thereto, not only the light emitting layer, but also the layer such as the hole injection layer (HIL) or the hole transport layer (HTL) can also be printed. In particular, the hole injection layer is formed through the patterning, thereby making it possible to suppress the leakage current. Also, the reverse printing block can be applied not only to the manufacture of the organic EL display device, but also to the formation of the color filter.

The present disclosure contains subject matter related to that disclosed in Japanese Priority Patent Application JP 2011-068152 filed in the Japan Patent Office on Mar. 25, 2011, the entire content of which is hereby incorporated by reference.

What is claimed is:

1. A printing method, comprising:
    forming a transfer layer on a counter substrate, the counter substrate having a plate shape; and
    pressing said transfer layer against a first area of a substrate having said first area and a second area adjacent to said first area such that a bubble is confined between the first area and the counter substrate, the substrate having a bubble discharging path, the bubble discharging path comprising a trench formed in the substrate and extending along a portion of the substrate from the first area to the second area, the pressing thereby forming a film having a first pattern on said first area and discharging the bubble from said first area to said second area through said bubble discharging path,
    wherein said first area is a display area in which pixels are provided so as to have the first pattern.

2. The printing method according to claim 1, wherein said first area comprises a recessed portion having a second pattern reverse to the first pattern, and
    said counter substrate is a blanket in which said transfer layer is formed on a contact surface between said substrate and said counter substrate.

3. The printing method according to claim 1, wherein said counter substrate is a blanket in which said transfer layer comprises an organic layer having the first pattern that is formed on a contact surface between said substrate and said counter substrate.

4. A method of manufacturing a display device, comprising:
    forming display elements on a substrate,
    said process of forming of said display elements on said substrate including:
        forming a transfer layer on a counter substrate, the counter substrate having a plate shape, and
        pressing said transfer layer against a first area of a substrate having said first area and a second area adjacent to said first area such that a bubble is confined between the first area and the counter substrate, the substrate having a bubble discharging path, the bubble discharging path comprising a trench formed in the substrate and extending along a portion of the substrate from the first area to the second area, the pressing thereby forming a film having a first pattern on said first area and discharging the bubble from said first area to said second area through said bubble discharging path.

5. The method of manufacturing a display device according to claim 4, wherein
   said first area is a printing area in which a recessed portion having a second pattern reverse to the first pattern is provided, and
   said counter substrate is a blanket in which said transfer layer is formed on a contact surface between said substrate and said counter substrate.

6. The method of manufacturing a display device according to claim 4, wherein
   said first area is a display area in which pixels are provided so as to have the first pattern, and
   said counter substrate is a blanket in which said transfer layer comprises an organic layer having the first pattern that is formed on a contact surface between said substrate and said counter substrate.

\* \* \* \* \*